US011682442B2

United States Patent
Tran et al.

(10) Patent No.: US 11,682,442 B2
(45) Date of Patent: *Jun. 20, 2023

(54) FORCED CURRENT ACCESS WITH VOLTAGE CLAMPING IN CROSS-POINT ARRAY

(71) Applicant: SanDisk Technologies LLC, Addison, TX (US)

(72) Inventors: Michael Nicolas Albert Tran, San Jose, CA (US); Ward Parkinson, Boise, ID (US); Michael Grobis, Campbell, CA (US); Nathan Franklin, Belmont, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/846,678

(22) Filed: Jun. 22, 2022

(65) Prior Publication Data

US 2022/0335998 A1     Oct. 20, 2022

Related U.S. Application Data

(63) Continuation of application No. 17/232,924, filed on Apr. 16, 2021, now Pat. No. 11,398,262.

(51) Int. Cl.
*G11C 11/16*     (2006.01)
*H01L 27/22*     (2006.01)
(Continued)

(52) U.S. Cl.
CPC ...... *G11C 11/1659* (2013.01); *G11C 11/1655* (2013.01); *G11C 11/1657* (2013.01);
(Continued)

(58) Field of Classification Search
CPC ............ G11C 11/1659; G11C 11/1655; G11C 11/1657; G11C 11/1673; G11C 11/1675;
(Continued)

(56) References Cited

U.S. PATENT DOCUMENTS 7,272,034 B1    9/2007   Chen et al.
7,286,395 B2    10/2007   Chen et al.
(Continued)

FOREIGN PATENT DOCUMENTS

JP        2020135917 A    8/2020
TW        I424444 B      1/2014
(Continued)

OTHER PUBLICATIONS

U.S. Appl. No. 17/232,924, filed Apr. 16, 2021.
(Continued)

*Primary Examiner* — Tri M Hoang
(74) *Attorney, Agent, or Firm* — Vierra Magen Marcus LLP

(57) ABSTRACT

Technology for limiting a voltage difference between two selected conductive lines in a cross-point array when using a forced current approach is disclosed. In one aspect, the selected word line voltage is clamped to a voltage limit while driving an access current through a region of the selected word line and through a region of the selected bit line. The access current flows through the memory cell to allow a sufficient voltage to successfully read or write the memory cell, while not placing undue stress on the memory cell. In some aspects, the maximum voltage that is permitted on the selected word line depends on the location of the selected memory cell in the cross-point memory array. This allows memory cells for which there is a larger IR drop to receive an adequate voltage, while not over-stressing memory cells for which there is a smaller IR drop.

20 Claims, 27 Drawing Sheets

(51) Int. Cl.
*H01L 43/02* (2006.01)
*H01L 43/08* (2006.01)
*H01L 27/24* (2006.01)

(52) U.S. Cl.
CPC ...... *G11C 11/1673* (2013.01); *G11C 11/1675* (2013.01); *G11C 11/1695* (2013.01); *G11C 11/1697* (2013.01); *H01L 27/222* (2013.01); *H01L 43/02* (2013.01); *H01L 43/08* (2013.01); *H01L 27/2481* (2013.01)

(58) Field of Classification Search
CPC ............ G11C 11/1695; G11C 11/1697; H01L 27/222; H01L 43/02; H01L 43/08; H01L 27/2481
See application file for complete search history.

(56) References Cited

U.S. PATENT DOCUMENTS

| | | | |
|---|---|---|---|
| 7,773,443 | B2 | 8/2010 | Scheuerlein |
| 8,027,206 | B2 | 9/2011 | Yoon et al. |
| 8,107,280 | B2 | 1/2012 | Yoon et al. |
| 8,130,556 | B2 | 3/2012 | Lutze et al. |
| 8,729,950 | B2 | 5/2014 | Gagne et al. |
| 9,058,885 | B2 | 6/2015 | Luo et al. |
| 9,064,590 | B2 | 6/2015 | Ueda |
| 9,183,912 | B2 | 11/2015 | Gogl et al. |
| 9,437,289 | B2 | 9/2016 | Oh et al. |
| 9,711,215 | B2 | 7/2017 | Manipatruni et al. |
| 10,102,897 | B2 * | 10/2018 | Park ................... G11C 13/004 |
| 10,153,017 | B2 | 12/2018 | Yang et al. |
| 10,297,317 | B2 | 5/2019 | Suzuki et al. |
| 10,446,228 | B2 * | 10/2019 | Luo .................. G11C 13/0023 |
| 10,600,478 | B2 | 3/2020 | Tzoufras et al. |
| 10,755,752 | B2 * | 8/2020 | Takizawa ........... G11C 13/0061 |
| 10,770,137 | B2 * | 9/2020 | Gangasani .............. G11C 8/12 |
| 10,825,517 | B2 * | 11/2020 | Gangasani ........ G11C 13/0023 |
| 11,145,364 | B2 * | 10/2021 | Park ..................... G11C 13/003 |
| 11,398,262 | B1 * | 7/2022 | Tran ................... G11C 11/1695 |
| 2007/0258282 | A1 | 11/2007 | Ueda et al. |
| 2022/0084575 | A1 | 3/2022 | Katayama |

FOREIGN PATENT DOCUMENTS

| | | |
|---|---|---|
| TW | 201824276 A | 7/2018 |
| WO | 2008105155 A1 | 9/2008 |

OTHER PUBLICATIONS

Notice of Allowance dated Apr. 21, 2022, U.S. Appl. No. 17/232,924, filed Apr. 16, 2021.
U.S. Appl. No. 17/846,684, filed Jun. 22, 2022.
Non-final Office Action dated Nov. 30, 2022, U.S. Appl. No. 17/846,684, filed Jun. 22, 2022.
Response to Office Action dated Dec. 23, 2022, U.S. Appl. No. 17/846,684, filed Jun. 22, 2022.
Notice of Allowance dated Feb. 14, 2023, U.S. Appl. No. 17/846,684, filed Jun. 22, 2022.

* cited by examiner

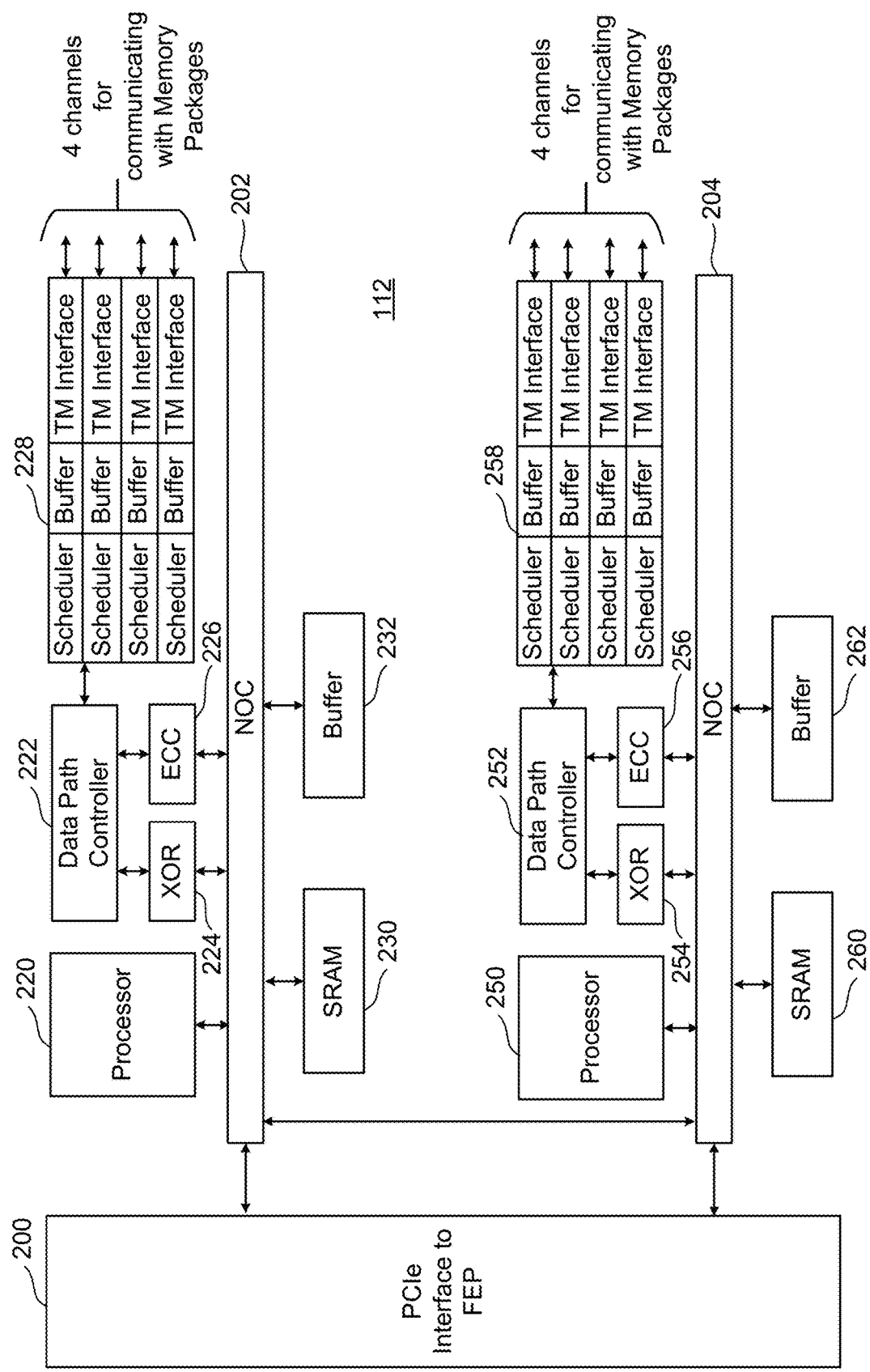

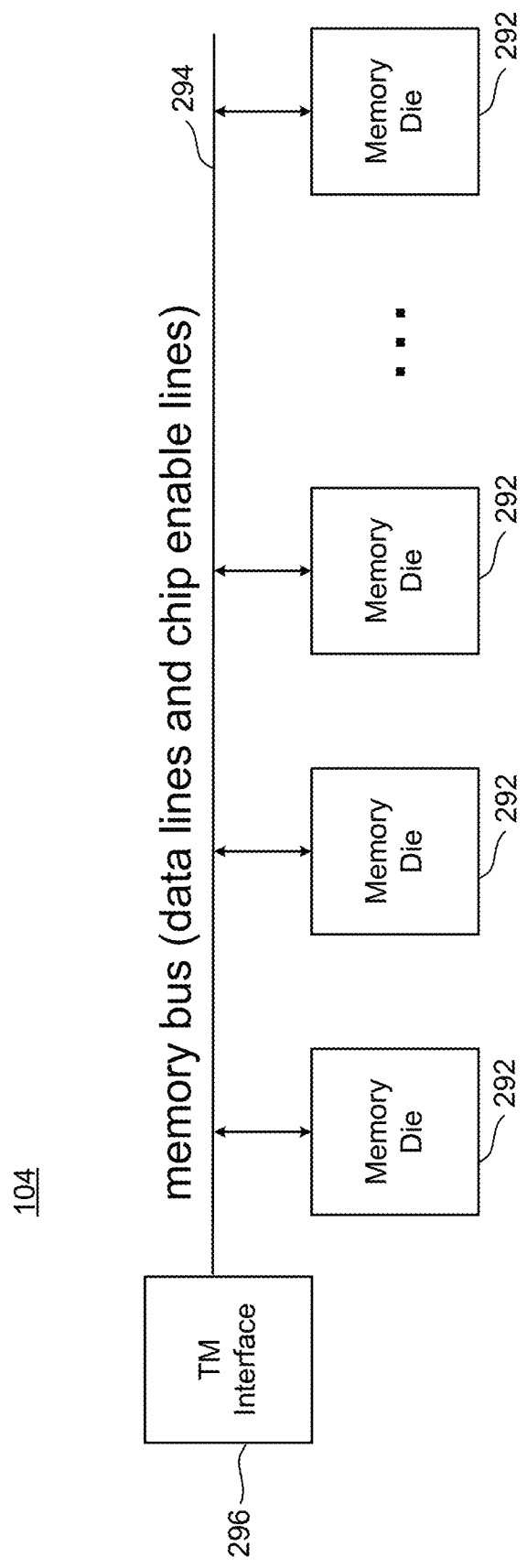

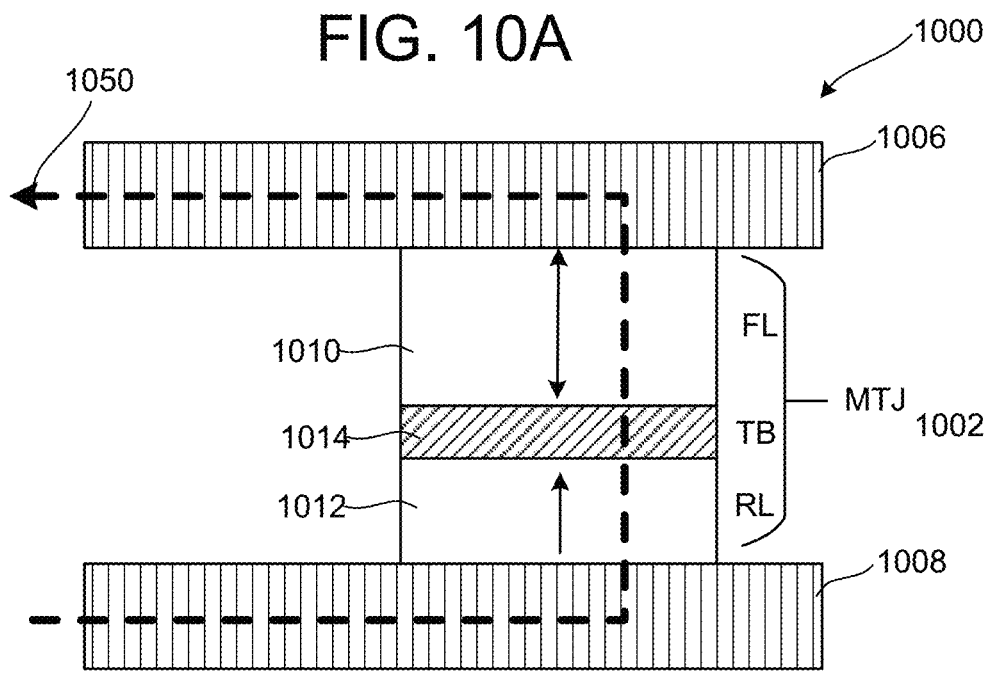
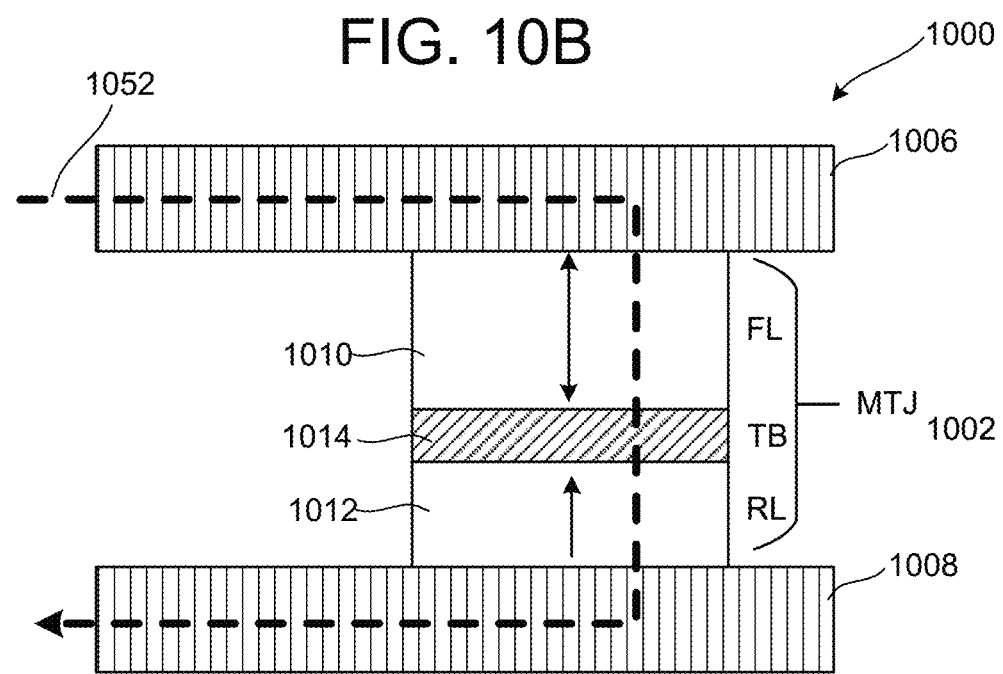

US 11,682,442 B2

FORCED CURRENT ACCESS WITH VOLTAGE CLAMPING IN CROSS-POINT ARRAY

CLAIM OF PRIORITY

The present application claims priority from U.S. patent application Ser. No. 17/232,924, entitled "FORCED CURRENT ACCESS WITH VOLTAGE CLAMPING IN CROSS-POINT ARRAY" by Tran et al., filed Apr. 16, 2021, issued as U.S. Pat. No. 11,398,262 on Jul. 26, 2022, incorporated by reference herein in its entirety.

BACKGROUND

Memory is widely used in various electronic devices such as cellular telephones, digital cameras, personal digital assistants, medical electronics, mobile computing devices, non-mobile computing devices, and data servers. Memory may comprise non-volatile memory or volatile memory. A non-volatile memory allows information to be stored and retained even when the non-volatile memory is not connected to a source of power (e.g., a battery).

In a memory array with a cross-point type architecture, a first set of conductive lines run across the surface of a substrate and a second set of conductive lines are formed over the first set of conductive lines, running over the substrate in a direction perpendicular to the first set of conductive lines. The memory cells are located at the cross-point junctions of the two sets of conductive lines. Memory cells in cross-point type architectures typically are reversible resistivity memory cells. A reversible resistivity cell is formed from a material having a programmable resistance. In a binary approach, the memory cell at each cross-point can be programmed into one of two resistance states: high and low. In some approaches, more than two resistance states may be used.

BRIEF DESCRIPTION OF THE DRAWING

Like-numbered elements refer to common components in the different figures.

FIG. 3 is a block diagram of one embodiment of a Back-End Processor Circuit. In some embodiments, the Back-End Processor Circuit is part of a memory controller.

FIG. 4 is a block diagram of one embodiment of a memory package.

FIGS. 10A and 10B illustrate the writing of an MRAM memory cell by use of a spin torque transfer (STT) mechanism.

DETAILED DESCRIPTION

Figure 1:
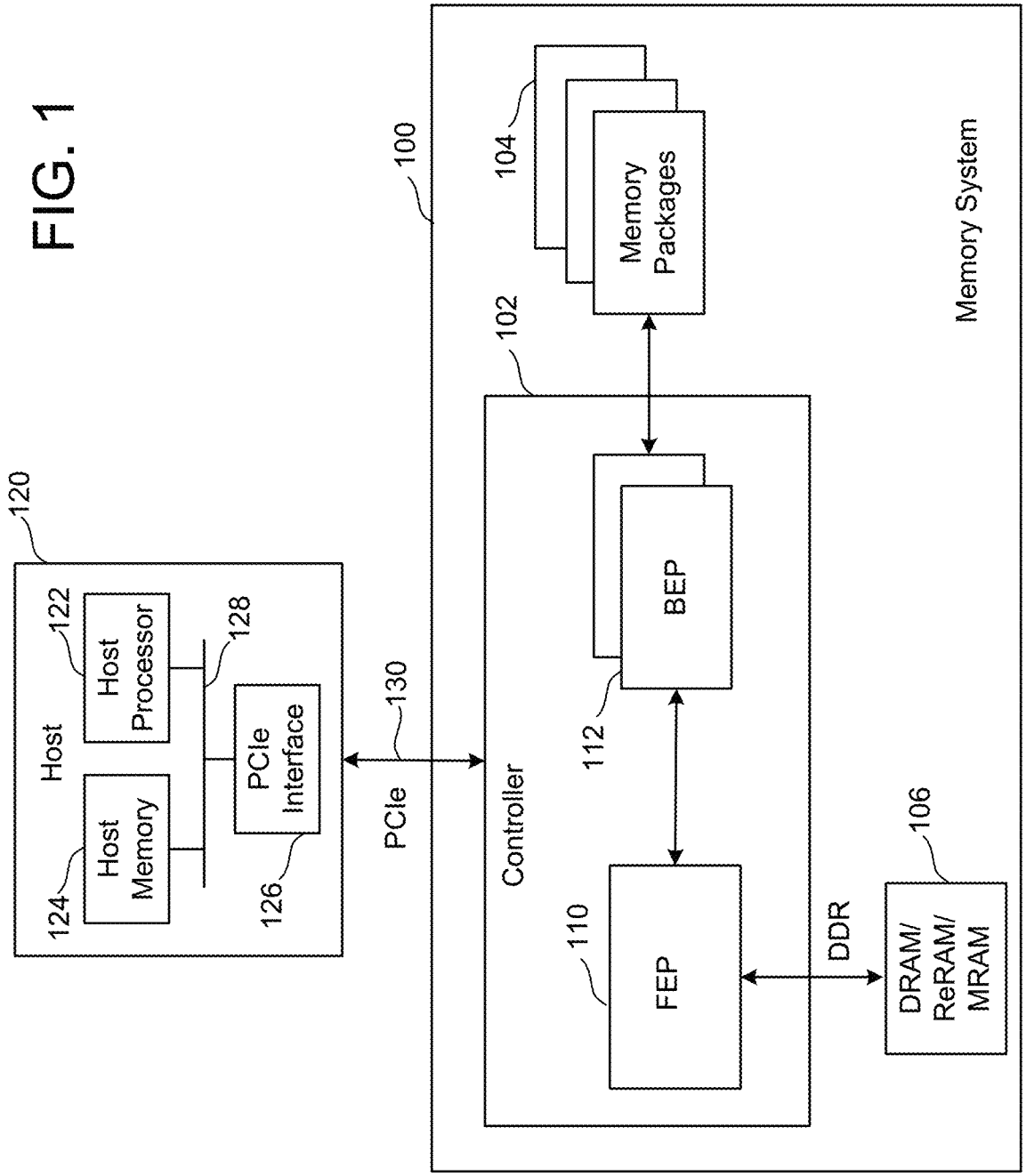
FIG. 1 is a block diagram of one embodiment of a non-volatile memory system connected to a host.

Technology is disclosed herein for clamping voltages in a cross-point memory array when using forced current access. Forced current access may be used to read and/or write the memory cells. In an embodiment, a memory cell is accessed by forcing a current through the selected word line while applying a select voltage to a selected bit line. The access current flows through a portion of the selected word line, through the selected memory cell, and also through a portion of the selected bit line. A voltage will appear across the selected memory cell in response to the access current. The voltage across the selected memory cell will depend on the magnitude of the access current and the resistance of the memory cell.

In some embodiments, the memory cells in the cross-point array are magnetoresistive random access memory (MRAM) cells. An MRAM cell uses magnetization to represent stored data, in contrast to some other memory technologies that use electronic charges to store data. A bit of data is written to an MRAM cell by changing the direction of magnetization of a magnetic element ("the free layer") within the MRAM cell, and a bit is read by measuring the resistance of the MRAM cell (low resistance typically represents a "0" bit and high resistance typically represents a "1" bit). As used herein, direction of magnetization is the direction that the magnetic moment is oriented with respect to a reference direction set by another element of the MRAM ("the reference layer"). In some embodiments, the low resistance is referred to as a parallel or P-state and the high resistance is referred to as an anti-parallel or AP-state. MRAM can use the spin-transfer torque effect to change the direction of the magnetization from P-state to AP-state and vice-versa, which typically requires bipolar operation for writes.

MRAM cells can have differences in the diameter of the magnetic element due to limitations in the fabrication process. One conventional approach uses a voltage source for writing reversible resistivity memory cells such as MRAM cells. A voltage source can compensate for variability in the MRAM cells because the switching voltage is relatively independent of the diameter of the magnetic element. However, in some embodiments, the MRAM cell has a threshold switching selector in series with the programmable resistive element. An example of a threshold switching selector is an Ovonic Threshold Switch (OTS). Using a voltage source does not compensate for variations in such threshold switching selectors. A forced current approach can compensate for variations in such threshold switching selectors. A forced current approach can also compensate for issues such as voltage drop across the selected word line and the selected bit line due to resistances of the word line and bit line. However, a forced current approach could stress smaller diameter MRAM cells. Hence, it is possible for a forced current approach to have a negative impact on endurance.

In order to successfully write an MRAM cell, there should be a sufficiently large write current. Alternatively, there should be a sufficiently large write voltage to successfully write an MRAM cell. Likewise, in order to successfully read an MRAM cell, there should be a sufficiently large read current. Alternatively, there should be a sufficiently large read voltage to successfully read an MRAM cell. If, for example, the write voltage is not large enough then the bit error rate will be higher than can be corrected by error correction circuitry. However, if, for example, the write voltage is too high then undue stress is placed on the reversible-resistivity memory cell and reduces endurance.

Techniques are disclosed herein for limiting a voltage difference between two selected conductive lines in the cross-point array when using a forced current approach. In one embodiment, the selected word line voltage is clamped to a voltage limit (voltage compliance) while driving an access current (current force) through a portion of the selected word line and through a portion of the selected bit line and into the selected memory cell. The access current flows through the selected memory cell to successfully read or write the selected memory cell with a tolerable bit error rate, while the voltage limit helps to avoid placing undue stress on the memory cell. By a tolerable bit error rate it is meant that an error correction algorithm can correct errors in data read from a group of memory cells, providing that the bit error rate is not too high.

There will be some drop in voltage due to the current flowing through a portion of the selected word line and a portion of the selected bit line due to resistances of the word line and the bit line. Herein, this voltage drop will be referred to as an (tile wire) IR drop (or current-resistance drop). The amount of IR drop will depend on the selected memory cell location in the cross-point memory array (e.g., the distance of the memory cell from a driver on the x-wire (e.g., word line) and a driver on the y-wire (e.g., bit line). cell). In some embodiments, the maximum voltage that is permitted between the selected word line and the selected bit line depends on the location of the selected memory cell in the cross-point memory array. For example, when there will be a larger IR drop, the maximum voltage is set to a higher level, in effect adjusting the voltage compliance by position or "zone". This allows memory cells for which there will be a larger IR drop to receive an adequate voltage, while helping to avoid over-stressing memory cells for which there will be a smaller IR drop.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable tolerance for a given application.

FIG. 1 is a block diagram of one embodiment of a non-volatile memory system (or more briefly "memory system") 100 connected to a host 120. Memory system 100 can implement the technology presented herein for concurrent multi-bit access (i.e., concurrent access of multiple memory cells) in a cross-point array. Many different types of memory systems can be used with the technology proposed herein. Example memory systems include solid state drives ("SSDs"), memory cards and embedded memory devices; however, other types of memory systems can also be used.

Memory system 100 of FIG. 1 comprises a controller 102, non-volatile memory 104 for storing data, and local memory (e.g., DRAM/ReRAM/MRAM) 106. In one embodiment, memory controller 102 provides access to memory cells in a cross-point array in local memory 106. For example, controller 102 may provide for access in a cross-point array of MRAM cells in local memory 106. The combination of the memory controller 102 and local memory 106 may be referred to herein as a memory system. Memory controller 102 comprises a Front-End Processor (FEP) circuit 110 and one or more Back-End Processor (BEP) circuits 112. In one embodiment FEP circuit 110 is implemented on an ASIC. In one embodiment, each BEP circuit 112 is implemented on a separate ASIC. In other embodiments, a unified controller ASIC can combine both the front-end and back-end functions. The ASICs for each of the BEP circuits 112 and the FEP circuit 110 are implemented on the same semiconductor such that the memory controller 102 is manufactured as a System on a Chip ("SoC"). FEP circuit 110 and BEP circuit 112 both include their own processors. In one embodiment, FEP circuit 110 and BEP circuit 112 work as a master slave configuration where the FEP circuit 110 is the master and each BEP circuit 112 is a slave. For example, FEP circuit 110 implements a Flash Translation Layer (FTL) or Media Management Layer (MML) that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory packages/die at the request of FEP circuit 110. For example, the BEP circuit 112 can carry out the read, erase, and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages.

In one embodiment, non-volatile memory 104 comprises a plurality of memory packages. Each memory package includes one or more memory die. Therefore, memory controller 102 is connected to one or more non-volatile memory die. In one embodiment, the memory package can include types of memory, such as storage class memory (SCM) based on resistive random access memory (such as ReRAM, MRAM, FeRAM or RRAM) or a phase change memory (PCM). In one embodiment, memory controller 102 provides access to memory cells in a cross-point array in a memory package 104.

Memory controller 102 communicates with host system 120 via an interface 130 that implements a protocol such as, for example, Compute Express Link (CXL). For working with memory system 100, host system 120 includes a host processor 122, host memory 124, and a PCIe interface 126 connected along bus 128. Host memory 124 is the host's physical memory, and can be DRAM, SRAM, MRAM, non-volatile memory, or another type of storage. Host 120 is external to and separate from memory system 100. In one embodiment, memory system 100 is embedded in host system 120. The combination of the host processor 122 and host memory 124 may be referred to herein as a memory system.

Figure 2:
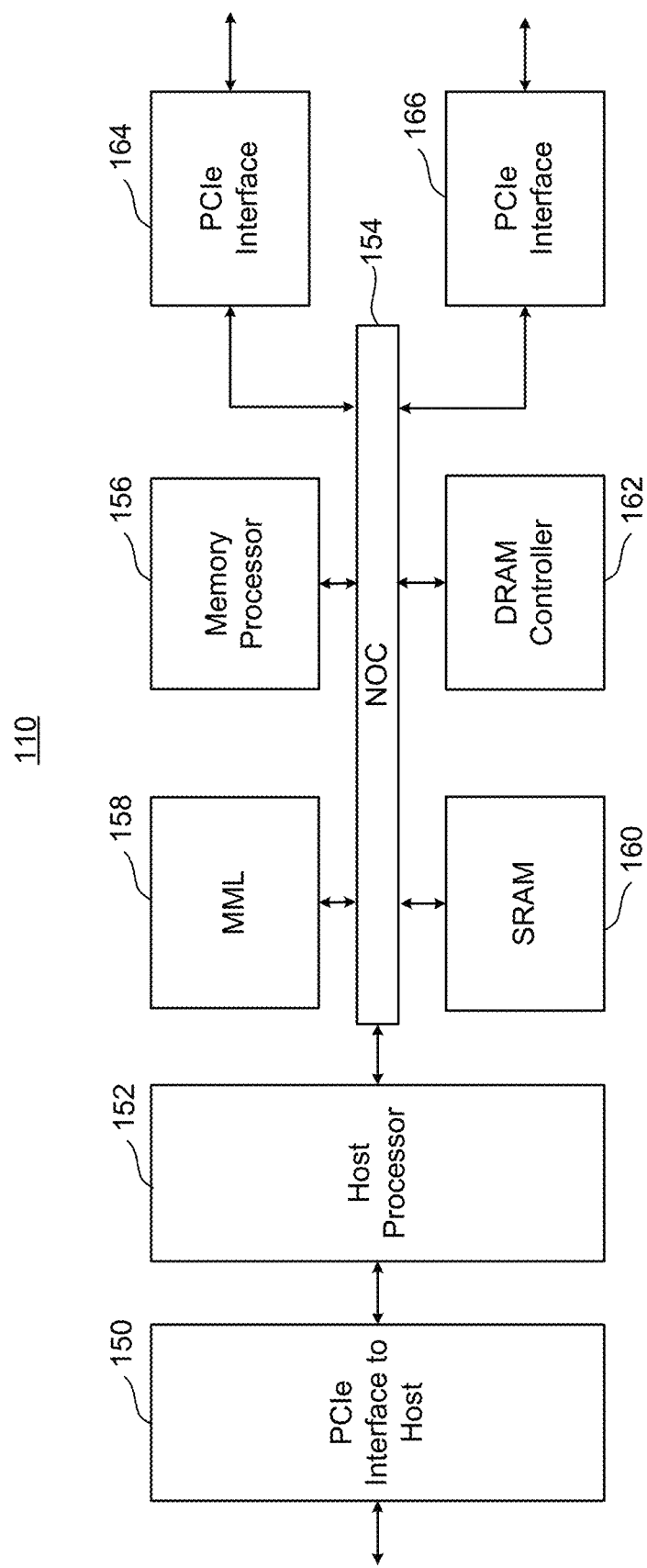
FIG. 2 is a block diagram of one embodiment of a Front-End Processor Circuit. In some embodiments, the Front-End Processor Circuit is part of a memory controller.

FIG. 2 is a block diagram of one embodiment of FEP circuit 110. FIG. 2 shows a PCIe interface 150 to communicate with host system 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOCs can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106 in FIG. 1). SRAM 160 is local RAM memory used by memory processor 156. In one embodiment, there is an MRAM controller to operate and communicate with the MRAM (e.g., MRAM 106 in FIG. 1). In one embodiment, there is an MRAM controller to operate and communicate with ReRAM (e.g., ReRAM 106 in FIG. 1). Memory processor 156 is used to run the FEP circuit and perform the various memory operations. Also, in communication with the NOC are two PCIe Interfaces 164 and 166. In the embodiment of FIG. 2, the SSD controller will include two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

FEP circuit 110 can also include a Media Management Layer (MML) 158 that performs memory management (e.g., garbage collection, wear leveling, load balancing, etc.), logical to physical address translation, communication with the host, management of DRAM (local volatile memory) and management of the overall operation of the SSD or other non-volatile storage system. The media management layer MML 158 may be integrated as part of the memory management that may handle memory errors and interfacing with the host. In particular, MML may be a module in the FEP circuit 110 and may be responsible for the internals of memory management. In particular, the MML 158 may include an algorithm in the memory device firmware which translates writes from the host into writes to the memory structure (e.g., 502 of FIGS. 5A and 5B below) of a die. The MML 158 may be needed because: 1) the memory may have limited endurance; 2) the memory structure may only be written in multiples of pages; and/or 3) the memory structure may not be written unless it is erased as a block. The MML 158 understands these potential limitations of the memory structure which may not be visible to the host. Accordingly, the MML 158 attempts to translate the writes from host into writes into the memory structure.

FIG. 3 is a block diagram of one embodiment of the BEP circuit 112. FIG. 3 shows a PCIe Interface 200 for communicating with the FEP circuit 110 (e.g., communicating with one of PCIe Interfaces 164 and 166 of FIG. 2). PCIe Interface 200 is in communication with two NOCs 202 and 204. In one embodiment the two NOCs can be combined into one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a programming error. Data path controller 222 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer, and TM Interface for each of the channels. The processor can be any standard processor known in the art. The data path controllers 222/252 can be a processor, FPGA, microprocessor, or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

FIG. 4 is a block diagram of one embodiment of a memory package 104 that includes a plurality of memory die 292 connected to a memory bus (data lines and chip enable lines) 294. The memory bus 294 connects to a Toggle Mode Interface 296 for communicating with the TM Interface of a BEP circuit 112 (see e.g., FIG. 3). In some embodiments, the memory package can include a small controller connected to the memory bus and the TM Interface. The memory package can have one or more memory die. In one embodiment, each memory package includes eight or 16 memory die; however, other numbers of memory die can also be implemented. The technology described herein is not limited to any particular number of memory die.

Figure 5A:
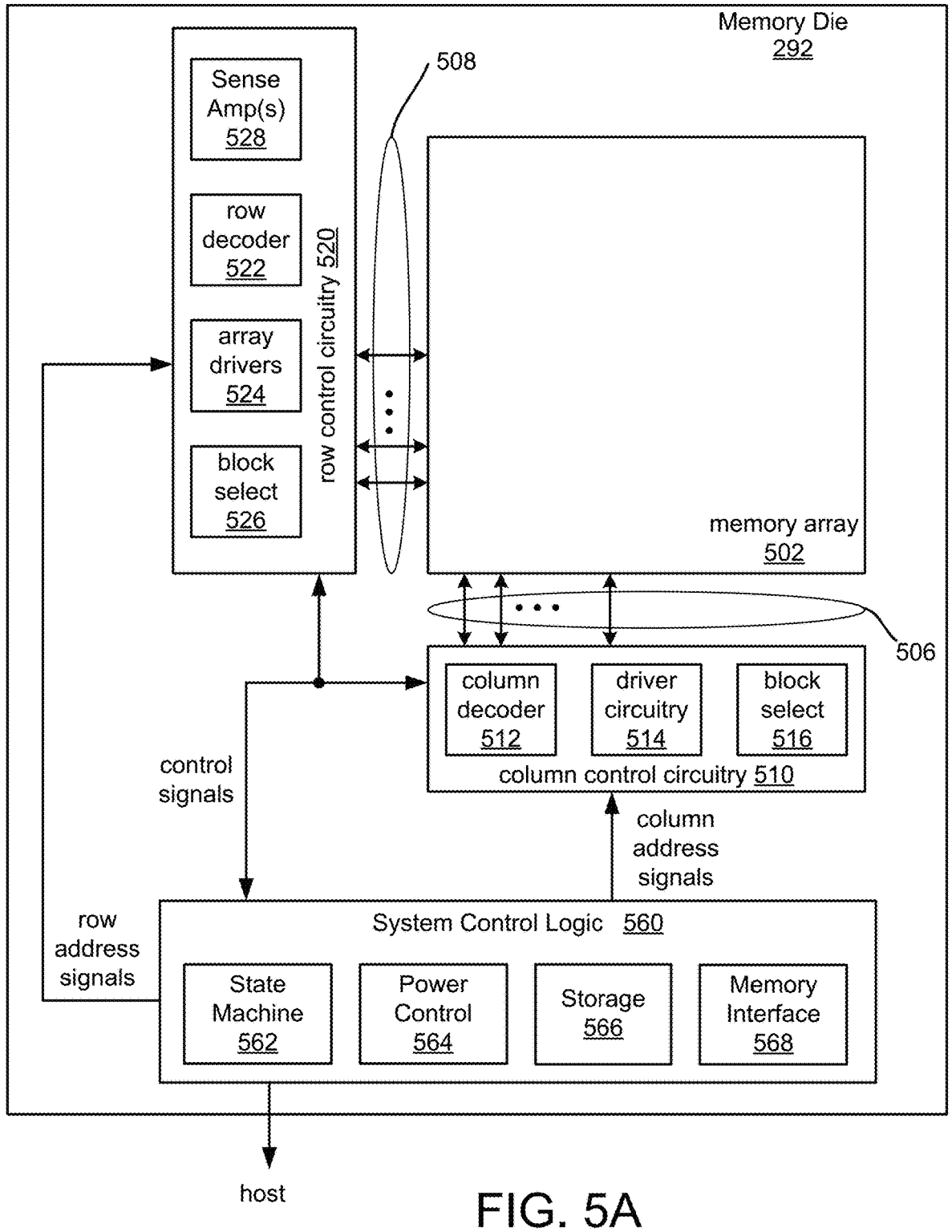
FIG. 5A is a block diagram of one embodiment of a memory die.

FIG. 5A is a block diagram that depicts one example of a memory die 292 that can implement the technology described herein. Memory die 292 includes a memory array 502 that can include any of memory cells described in the following. The array terminal lines of memory array 502 include the various layer(s) of word lines organized as rows, and the various layer(s) of bit lines organized as columns. However, other orientations can also be implemented. Memory die 292 includes row control circuitry 520, whose outputs 508 are connected to respective word lines of the memory array 502. Row control circuitry 520 receives a group of M row address signals and one or more various control signals from System Control Logic circuit 560, and typically may include such circuits as row decoders 522, array terminal drivers 524, and block select circuitry 526 for both reading and writing operations. Row control circuitry 520 may also include read/write circuitry. In an embodiment, row control circuitry 520 has sense amplifiers 528, which each contain circuitry for sensing a condition (e.g., voltage) of a word line of the memory array 502. In an embodiment, by sensing a word line voltage, a condition of a memory cell in a cross-point array is determined. Memory die 292 also includes column control circuitry 510 whose input/outputs 506 are connected to respective bit lines of the memory array 502. Although only single block is shown for array 502, a memory die can include multiple arrays or "tiles" that can be individually accessed. Column control circuitry 510 receives a group of N column address signals and one or more various control signals from System Control Logic 560, and typically may include such circuits as column decoders 512, array terminal receivers or drivers 514, block select circuitry 516, as well as read/write circuitry, and I/O multiplexers.

System control logic 560 receives data and commands from a host system and provides output data and status to the host system. In other embodiments, system control logic 560 receives data and commands from a separate controller circuit and provides output data to that controller circuit, with the controller circuit communicating with the host system. In some embodiments, the system control logic 560 can include a state machine 562 that provides die-level control of memory operations. In one embodiment, the state machine 562 is programmable by software. In other embodiments, the state machine 562 does not use software and is completely implemented in hardware (e.g., electrical circuits). In another embodiment, the state machine 562 is replaced by a micro-controller or microprocessor. The system control logic 560 can also include a power control module 564 controls the power and voltages supplied to the rows and columns of the memory 502 during memory operations and may include charge pumps and regulator circuit for creating regulating voltages. System control logic 560 includes storage 566, which may be used to store parameters for operating the memory array 502.

Commands and data are transferred between the memory controller 102 and the memory die 292 via memory controller interface 568 (also referred to as a "communication interface"). Memory controller interface 568 is an electrical interface for communicating with memory controller 102. Examples of memory controller interface 568 include a Toggle Mode Interface. Other I/O interfaces can also be used. For example, memory controller interface 568 may implement a Toggle Mode Interface that connects to the Toggle Mode interfaces of memory interface 228/258 for memory controller 102. In one embodiment, memory controller interface 568 includes a set of input and/or output (I/O) pins that connect to the controller 102. In another embodiment, the interface is JEDEC standard DDRn or LPDDRn, such as DDR5 or LPDDR5, or a subset thereof with smaller page and/or relaxed timing.

In some embodiments, all of the elements of memory die 292, including the system control logic 560, can be formed as part of a single die. In other embodiments, some or all of the system control logic 560 can be formed on a different die.

In one embodiment, memory structure 502 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In another embodiment, memory structure 502 comprises a two-dimensional memory array of non-volatile memory cells.

The exact type of memory array architecture or memory cell included in memory structure 502 is not limited to the examples above. Many different types of memory array architectures or memory technologies can be used to form memory structure 326. No particular non-volatile memory technology is required for purposes of the new claimed embodiments proposed herein. Other examples of suitable technologies for memory cells of the memory structure 502 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 502 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive random access memory (MRAM) stores data using magnetic storage elements. The elements are formed from two ferromagnetic layers, each of which can hold a magnetization, separated by a thin insulating layer. For a field-controlled MRAM, one of the two layers is a permanent magnet set to a particular polarity; the other layer's magnetization can be changed to match that of an external field to store memory. Other types of MRAM cells are possible. A memory device may be built from a grid of MRAM cells. In one embodiment for programming, each memory cell lies between a pair of write lines arranged at right angles to each other, parallel to the cell, one above and one below the cell. For some MRAM cells, when current is passed through them, an induced magnetic field is created. MRAM based memory embodiments will be discussed in more detail below.

Phase change memory (PCM) exploits the unique behavior of chalcogenide glass. One embodiment uses a GeTe-Sb2Te3 super lattice to achieve non-thermal phase changes by simply changing the co-ordination state of the Germanium atoms with a laser pulse (or light pulse from another source). The memory cells are programmed by current pulses that can change the co-ordination of the PCM material or switch it between amorphous and crystalline states. Note that the use of "pulse" in this document does not require a square pulse but includes a (continuous or non-continuous) vibration or burst of sound, current, voltage light, or other wave. And the current forced for Write can, for example, be driven rapidly to a peak value and then linearly ramped lower with, for example, a 500 ns edge rate. Such peak current force may be limited by a zoned voltage compliance that varies by position of the memory cell along the word line or bit line.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 5A can be grouped into two parts, the memory structure 502 and the peripheral circuitry, including all of the other elements. An important characteristic of a memory circuit is its capacity, which can be increased by increasing the area of the memory die 292 that is given over to the memory structure 502; however, this reduces the area of the memory die available for the peripheral circuitry. This can place quite severe restrictions on these peripheral elements. For example, the need to fit sense amplifier circuits within the available area can be a significant restriction on sense amplifier design architectures. With respect to the system control logic 560, reduced availability of area can limit the available functionalities that can be implemented on-chip. Consequently, a basic trade-off in the design of a memory die 292 is the amount of area to devote to the memory structure 502 and the amount of area to devote to the peripheral circuitry. Such tradeoffs may result in more IR drop from use of larger x-y arrays of memory between driving circuits on the word line and bit line, which in turn may be benefit more from use of voltage limit and zoning of the voltage compliance by memory cell position along the word line and bit line.

Another area in which the memory structure 502 and the peripheral circuitry are often at odds is in the processing involved in forming these regions, since these regions often involve differing processing technologies and the trade-off in having differing technologies on a single die. For example, elements such as sense amplifier circuits, charge pumps, logic elements in a state machine, and other peripheral circuitry in system control logic 560 often employ PMOS devices. In some cases, the memory structure will be based on CMOS devices. Processing operations for manufacturing a CMOS die will differ in many aspects from the processing operations optimized for an NMOS technologies.

Figure 5B:
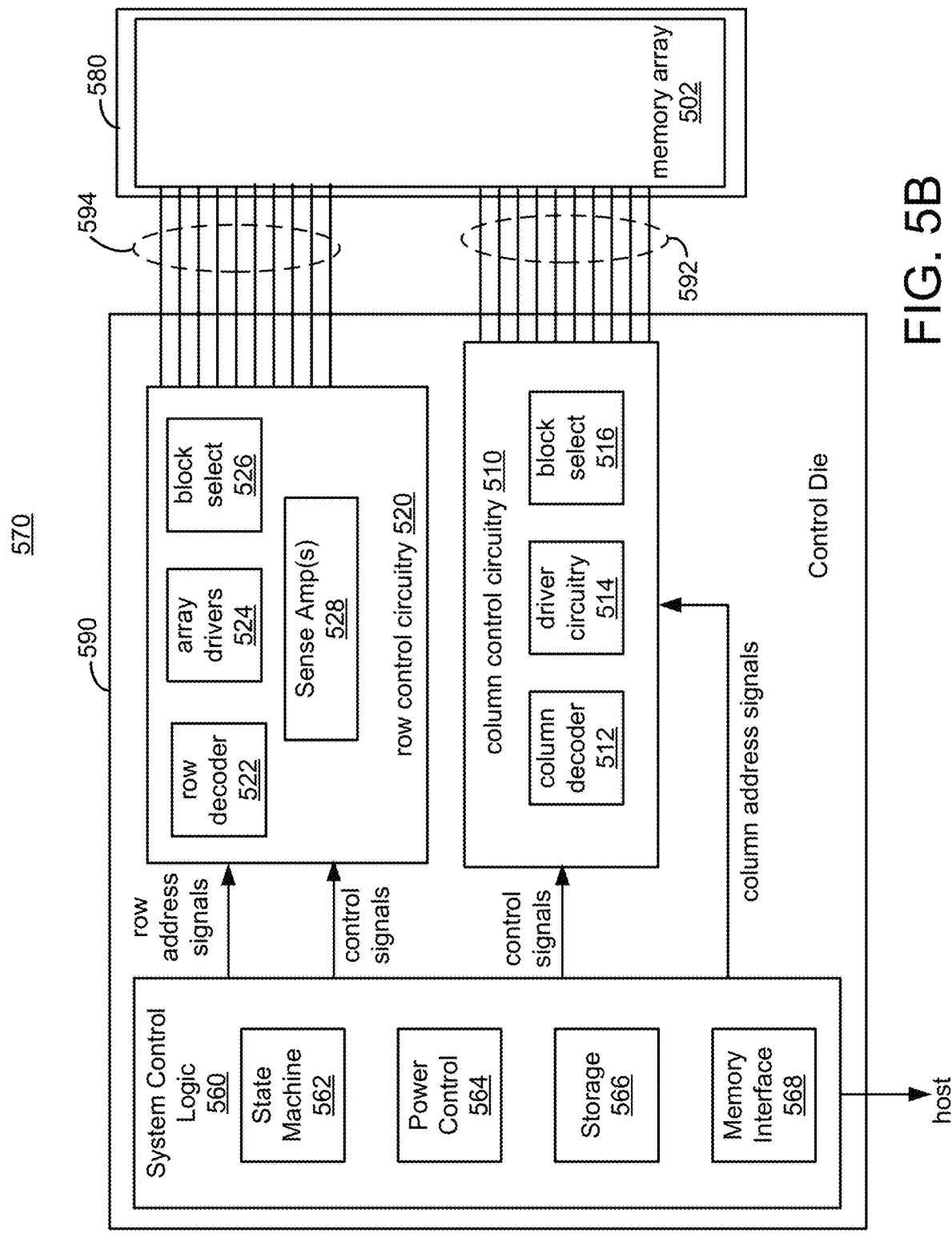
FIG. 5B is a block diagram of one embodiment of an integrated memory assembly containing a control die and a memory structure die.

To improve upon these limitations, embodiments described below can separate the elements of FIG. 5A onto separately formed dies that are then bonded together. FIG. 5B depicts an integrated memory assembly 570 having a memory structure die 580 and a control die 590. The memory structure 502 is formed on the memory structure die 580 and some or all of the peripheral circuitry elements, including one or more control circuits, are formed on the control die 590. For example, a memory structure die 580 can be formed of just the memory elements, such as the array of memory cells of MRAM memory, PCM memory, ReRAM memory, or other memory type. Some or all of the peripheral circuitry, even including elements such as decoders and sense amplifiers, can then be moved on to the control die. This allows each of the semiconductor dies to be optimized individually according to its technology. This allows more space for the peripheral elements, which can now incorporate additional capabilities that could not be readily incorporated were they restricted to the margins of the same die holding the memory cell array. The two die can then be bonded together in a bonded multi-die integrated memory assembly, with the array on the one die connected to the periphery elements on the other die. Although the following will focus on an integrated memory assembly of one memory die and one control die, other embodiments can use additional dies, such as two memory dies and one control die, for example.

As with 502 of FIG. 5A, the memory die 580 in FIG. 5B can include multiple independently accessible arrays or "tiles." System control logic 560, row control circuitry 520, and column control circuitry 510 are located in control die 590. In some embodiments, all or a portion of the column control circuitry 510 and all or a portion of the row control circuitry 520 are located on the memory structure die 580. In some embodiments, some of the circuitry in the system control logic 560 is located on the on the memory structure die 580.

FIG. 5B shows column control circuitry 510 on the control die 590 coupled to memory structure 502 on the memory structure die 580 through electrical paths 592. For example, electrical paths 592 may provide electrical connection between column decoder 512, driver circuitry 514, and block select 516 and bit lines of memory structure 502. Electrical paths may extend from column control circuitry 510 in control die 590 through pads on control die 590 that are bonded to corresponding pads of the memory structure die 580, which are connected to bit lines of memory structure 502. Each bit line of memory structure 502 may have a corresponding electrical path in electrical paths 592, including a pair of bond pads, which connects to column control circuitry 510. Similarly, row control circuitry 520, including row decoder 522, array drivers 524, block select 526, and sense amplifiers 528 are coupled to memory structure 502 through electrical paths 594. Each of electrical path 594 may correspond to, for example, a word line. Additional electrical paths may also be provided between control die 590 and memory die 580.

For purposes of this document, the phrase "a control circuit" can include one or more of controller 102, system control logic 560, column control circuitry 510, row control circuitry 520, a micro-controller, a state machine, host processor 122, and/or other control circuitry, or other analogous circuits that are used to control non-volatile memory. The control circuit can include hardware only or a combination of hardware and software (including firmware). For example, a controller programmed by firmware to perform the functions described herein is one example of a control circuit. A control circuit can include a processor, FGA, ASIC, integrated circuit, or other type of circuit. Such control circuitry may include drivers such as direct drive via connection of a node through fully on transistors (gate to the power supply) driving to a fixed voltage such as a power supply. Such control circuitry may include a current source driver where a transistor in the path is partially on and controlled by a current mirror to limit current to fixed amount, such as a read current, or write forward or write reverse current.

For purposes of this document, the term "apparatus" can include, but is not limited to, one or more of host system 120, the combination of host processor 122 and host memory 124, memory system 100, memory controller 102, the combination of memory controller 102 and local memory 106, memory package 104, integrated memory assembly 570, and/or control die 590.

In the following discussion, the memory array 502 of FIGS. 5A and 5B will be discussed in the context of a cross-point architecture. In a cross-point architecture, a first set of conductive lines or wires, such as word lines, run in a first direction relative to the underlying substrate and a second set of conductive lines or wires, such a bit lines, run in a second direction relative to the underlying substrate. The memory cells are sited at the intersection of the word lines and bit lines. The memory cells at these cross-points can be formed according to any of a number of technologies, including those described above. The following discussion will mainly focus on embodiments based on a cross-point architecture using MRAM memory cells, each in series with a selector such as Ovonic Threshold Switch (OTS) to comprise a selectable memory bit.

Figure 6A:
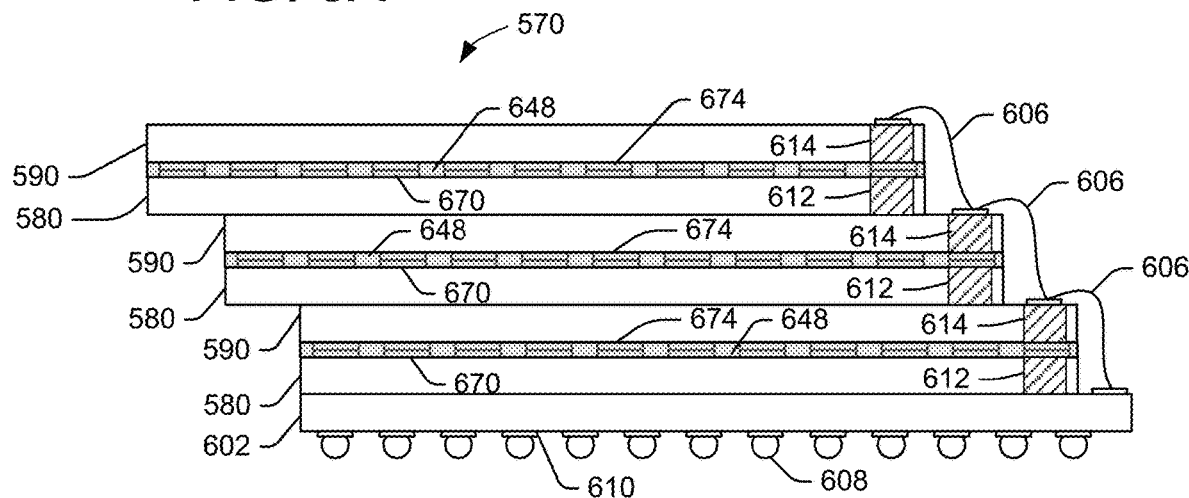
FIG. 6A depicts a side view of an embodiment of an integrated memory assembly stacked on a substrate.

In some embodiments, there is more than one control die 590 and more than one memory structure die 580 in an integrated memory assembly 570. In some embodiments, the integrated memory assembly 570 includes a stack of multiple control dies 590 and multiple memory structure dies 580. FIG. 6A depicts a side view of an embodiment of an integrated memory assembly 570 stacked on a substrate 602 (e.g., a stack comprising control dies 590 and memory structure dies 580). The integrated memory assembly 570 has three control dies 590 and three memory structure dies 580. In some embodiments, there are more than three memory structure dies 580 and more than three control dies 590.

Each control die 590 is affixed (e.g., bonded) to at least one of the memory structure dies 580. Each control die 590 has a number of bond pads 674 on a major surface of the control die 590. Each memory structure die 580 has a number of bond pads 670 on a major surface of the memory structure die 580. Note that there are bond pad pairs 670/674. In one embodiment, the pattern of bond pads 670 matches the pattern of bond pads 674. In some embodiments, bond pads 670 and/or 674 are flip-chip bond pads. Thus, the bond pads 670, 674 electrically and physically couple the memory die 580 to the control die 590. Also, the bond pads 670, 674 permit internal signal transfer between the memory die 580 and the control die 590. Thus, the memory die 580 and the control die 590 are bonded together with bond pads.

The bond pads 670, 674 may be formed for example of copper, aluminum, and alloys thereof. There may be a liner 648 between the bond pads 670, 674 and the major surfaces. The liner may be formed for example of a titanium/titanium nitride stack. The bond pads 670, 674 and liner may be applied by vapor deposition and/or plating techniques. The bond pads and liners together may have a thickness of 720 nm, though this thickness may be larger or smaller in further embodiments.

The bond pads allow for internal signal transfer. Herein, "internal signal transfer" means signal transfer between the control die 590 and the memory die 580. The internal signal transfer permits the circuitry on the control die 590 to control memory operations in the memory die 580. Therefore, the bond pads 670, 674 may be used for memory operation signal transfer. Herein, "memory operation signal transfer" refers to any signals that pertain to a memory operation in a memory die 580. A memory operation signal transfer could include, but is not limited to, providing a voltage, providing a current, receiving a voltage, receiving a current, sensing a voltage, and/or sensing a current.

There may be many more bond pads than depicted in FIG. 6A. A space between two dies 580, 590 that are bonded together is filled with a solid layer 648, which may be formed from epoxy or other resin or polymer. This solid layer 648 protects the electrical connections between the dies 580, 590, and further secures the dies together. Various materials may be used as solid layer 648, but in embodiments, it may be Hysol epoxy resin from Henkel Corp., having offices in California, USA.

The integrated memory assembly 570 may for example be stacked with a stepped offset, leaving the bond pads at each level uncovered and accessible from above. Wire bonds 606 connected to the bond pads connect the control die 590 to the substrate 602. A number of such wire bonds may be formed across the width of each control die 590 (i.e., into the page of FIG. 6A).

A memory structure die through silicon via (TSV) 612 may be used to route signals through a memory structure die 580. A control die through silicon via (TSV) 614 may be used to route signals through a control die 590. The TSVs 612, 614 may be formed before, during or after formation of the integrated circuits in the semiconductor dies 580, 590. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 608 may optionally be affixed to contact pads 610 on a lower surface of substrate 602. The solder balls 608 may be used to electrically and mechanically couple the integrated memory assembly 570 to a host device such as a printed circuit board. Solder balls 608 may be omitted where the integrated memory assembly 570 is to be used as an LGA package. The solder balls 608 may form a part of the interface between the integrated memory assembly 570 and the memory controller 102.

Figure 6B:
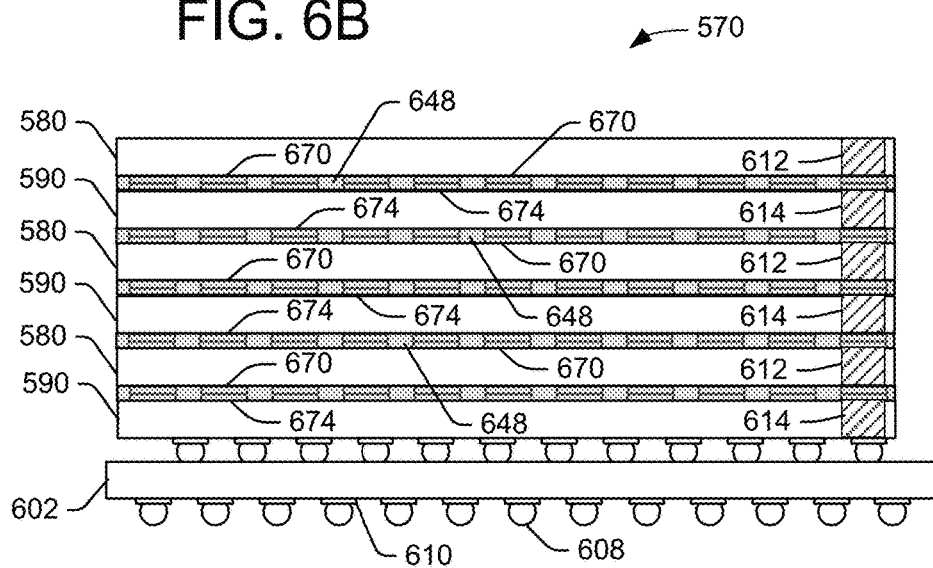
FIG. 6B depicts a side view of an embodiment of an integrated memory assembly stacked on a substrate.

FIG. 6B depicts a side view of an embodiment of an integrated memory assembly 570 stacked on a substrate 602. The integrated memory assembly 570 has three control dies 590 and three memory structure dies 580. In some embodiments, there are many more than three memory structure dies 580 and many more than three control dies 590. In this example, each control die 590 is bonded to at least one memory structure die 580. Optionally, a control die 590 may be bonded to two memory structure die 580.

Some of the bond pads 670, 674 are depicted. There may be many more bond pads. A space between two dies 580, 590 that are bonded together is filled with a solid layer 648, which may be formed from epoxy or other resin or polymer.

In contrast to the example in FIG. 6A, the integrated memory assembly 570 in FIG. 6B does not have a stepped offset. A memory structure die through silicon via (TSV) 612 may be used to route signals through a memory structure die 580. A control die through silicon via (TSV) 614 may be used to route signals through a control die 590.

Solder balls 608 may optionally be affixed to contact pads 610 on a lower surface of substrate 602. The solder balls 608 may be used to electrically and mechanically couple the integrated memory assembly 570 to a host device such as a printed circuit board. Solder balls 608 may be omitted where the integrated memory assembly 570 is to be used as an LGA package.

As has been briefly discussed above, the control die 590 and the memory structure die 580 may be bonded together. Bond pads on each die 580, 590 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 6 µm square and spaced from each other with a pitch of 6 µm to 6 µm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 6 µm square and spaced from each other with a pitch of 1 µm to 6 µm. Bonding techniques may be used providing bond pads with even smaller sizes and pitches.

Some embodiments may include a film on surface of the dies 580, 590. Where no such film is initially provided, a space between the dies may be under filled with an epoxy or other resin or polymer. The under-fill material may be applied as a liquid which then hardens into a solid layer. This under-fill step protects the electrical connections between the dies 580, 590, and further secures the dies together. Various materials may be used as under-fill material, but in embodiments, it may be Hysol epoxy resin from Henkel Corp., having offices in California, USA.

Figure 7A:
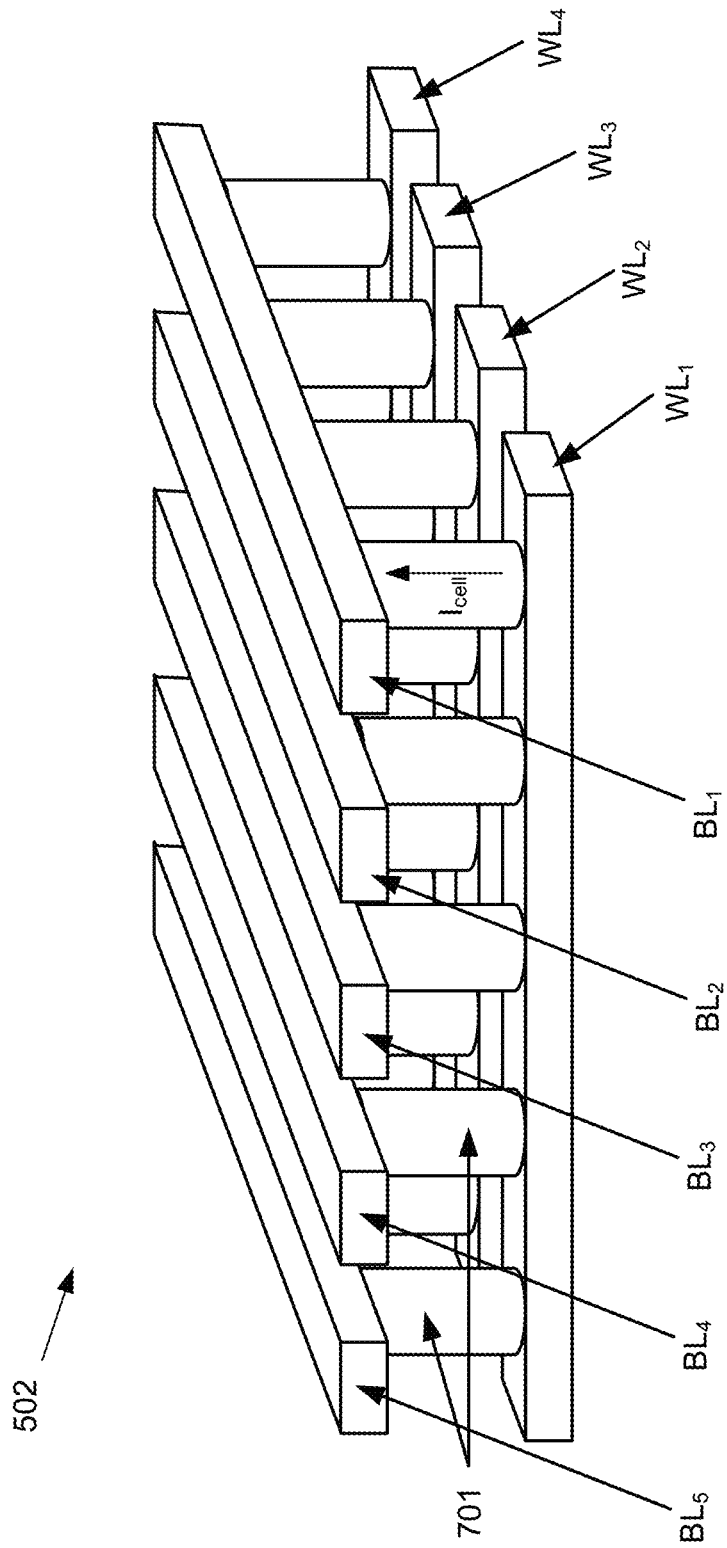
FIG. 7A depicts one embodiment of a portion of a memory array that forms a cross-point architecture in an oblique view.

FIG. 7A depicts one embodiment of a portion of a memory array that forms a cross-point architecture in an oblique view. Memory array 502 of FIG. 7A is one example of an implementation for memory array 502 in FIG. 5A or 5B, where a memory die 292 or memory structure die 580 can include multiple such array structures. The bit lines $BL_1$-$BL_5$ are arranged in a first direction (represented as running into the page) relative to an underlying substrate (not shown) of the die and the word lines $WL_1$-$WL_5$ are arranged in a second direction perpendicular to the first direction. FIG. 7A is an example of a horizontal cross-point structure in which word lines $WL_1$-$WL_5$ and $BL_1$-$BL_5$ both run in a horizontal direction relative to the substrate, while the memory cells, two of which are indicated at 701, are oriented so that the current through a memory cell (such as shown at $I_{cell}$) runs in the vertical direction. In a memory array with additional layers of memory cells, such as discussed below with respect to FIG. 7D, there would be corresponding additional layers of bit lines and word lines.

As depicted in FIG. 7A, memory array 502 includes a plurality of memory cells 701. The memory cells 701 may include re-writeable memory cells, such as can be implemented using ReRAM, MRAM, PCM, or other material with a programmable resistance. The following discussion will focus on MRAM memory cells, although much of the discussion can be applied more generally. The current in the memory cells of the first memory level is shown as flowing upward as indicated by arrow $I_{cell}$, but current can flow in either direction, as is discussed in more detail in the following.

Figure 7B:
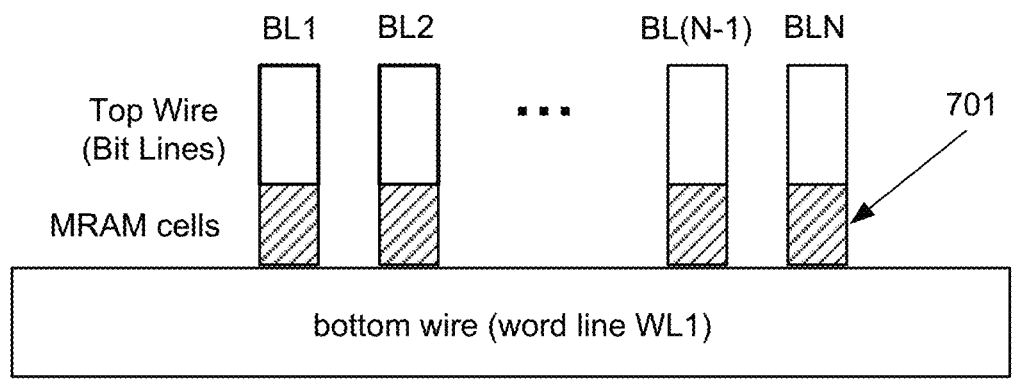
FIGS. 7B and 7C respectively present side and top views of the cross-point structure in FIG. 7A.
Figure 7C:
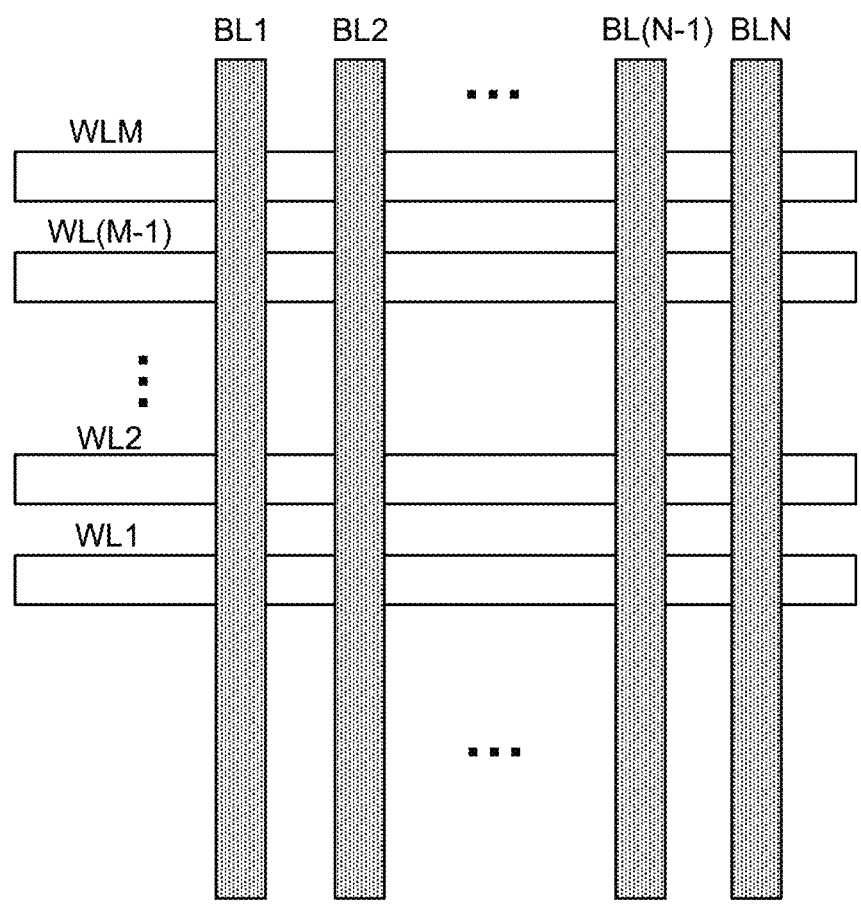

FIGS. 7B and 7C respectively present side and top views of the cross-point structure in FIG. 7A. The sideview of FIG. 7B shows one bottom wire, or word line, $WL_1$ and the top wires, or bit lines, $BL_1$-$BL_n$. At the cross-point between each top wire and bottom wire is an MRAM memory cell 701, although PCM, ReRAM, FeRAM, or other technologies can be used. FIG. 7C is a top view illustrating the cross-point structure for M bottom wires $WL_1$-$WL_M$ and N top wires $BL_1$-$BL_N$. In a binary embodiment, the MRAM cell at each cross-point can be programmed into one of two resistance states: high and low. More detail on embodiments for an MRAM memory cell design and techniques for their programming are given below. In some embodiments, sets of these wires are arrayed continuously as a "tile", and such tiles may be paired adjacently in the Word Line (WL) direction and orthogonally in the Bit Line direction to create a module. Such a module may be composed of 2×2 tiles to form a four tile combination wherein the WL drivers between the tiles is "center driven" between the tiles with the WL running continuously over the driver at the approximate center of the line. Similarly, BL drivers may be located between the pair of tiles paired in the BL direction to be center driven, whereby the driver and its area is shared between a pair of tiles. One embodiment of a module having four tiles is shown in FIG. 12B, which will be discussed below.

The cross-point array of FIG. 7A illustrates an embodiment with one layer of word lines and bits lines, with the MRAM or other memory cells sited at the intersection of the two sets of conducting lines. To increase the storage density of a memory die, multiple layers of such memory cells and conductive lines can be formed. A two-layer example is illustrated in FIG. 7D.

Figure 7D:
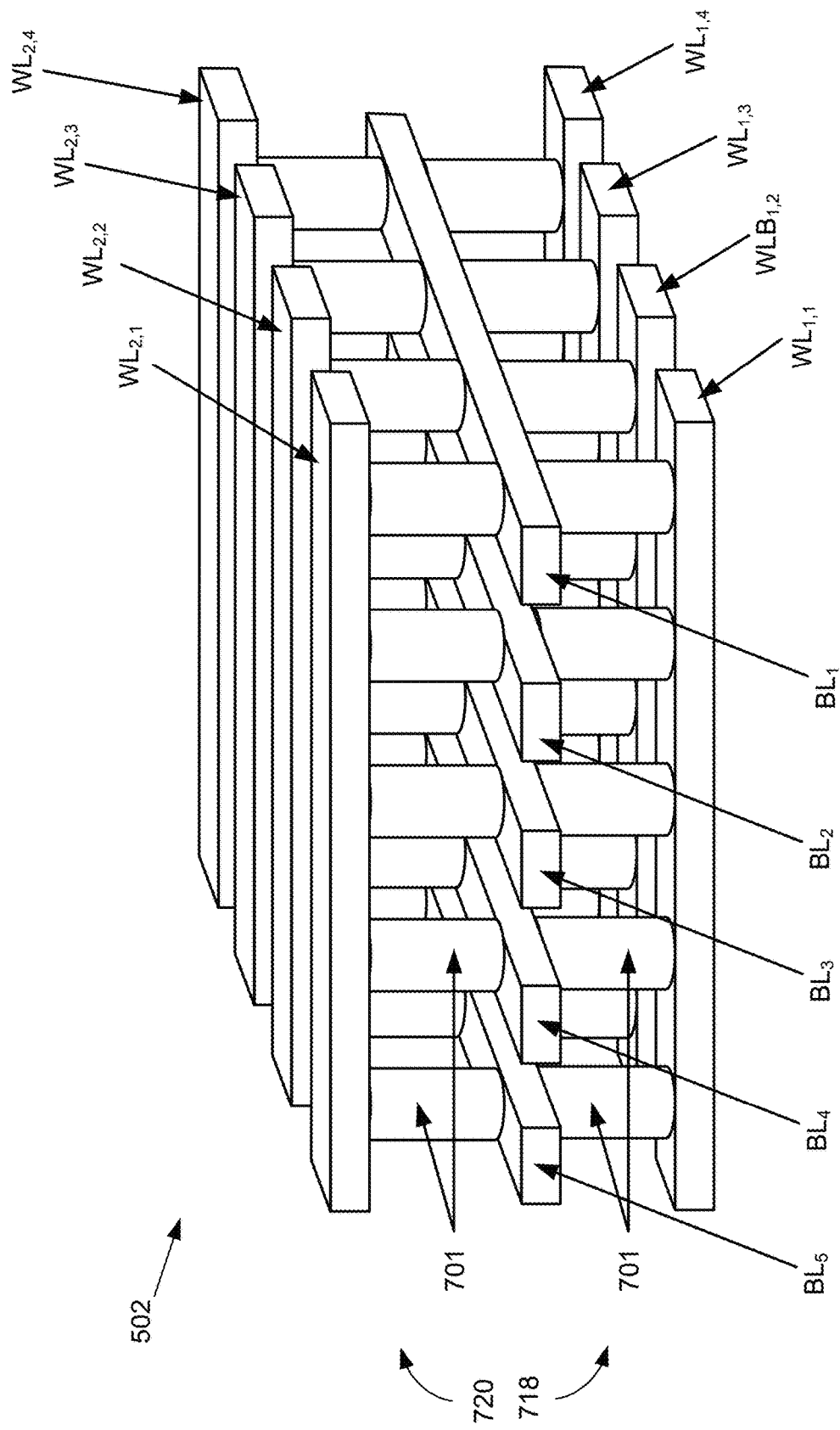
FIG. 7D depicts an embodiment of a portion of a two-level memory array that forms a cross-point architecture in an oblique view.

FIG. 7D depicts an embodiment of a portion of a two-level memory array that forms a cross-point architecture in an oblique view. As in FIG. 7A, FIG. 7D shows a first layer 718 of memory cells 701 of an array 502 connected at the cross-points of the first layer of word lines $WL_{1,1}$-$WL_{1,4}$ and bit lines $BL_1$-$BL_5$. A second layer of memory cells 720 is formed above the bit lines $BL_1$-$BL_5$ and between these bit lines and a second set of word lines $WL_{2,1}$-$WL_{2,4}$. Although FIG. 7D shows two layers, 718 and 720, of memory cells, the structure can be extended upward through additional alternating layers of word lines and bit lines. Depending on the embodiment, the word lines and bit lines of the array of FIG. 7D can be biased for read or program operations such that current in each layer flows from the word line layer to the bit line layer or the other way around. The two layers can be structured to have current flow in the same direction in each layer for a given operation or to have current flow in the opposite directions by driver selection in the positive or negative direction.

The use of a cross-point architecture allows for arrays with a small footprint and several such arrays can be formed on a single die. The memory cells formed at each cross-point can be a resistive type of memory cell, where data values are encoded as different resistance levels. Depending on the embodiment, the memory cells can be binary valued, having either a low resistance state or a high resistance state, or multi-level cells (MLCs) that can have additional resistance intermediate to the low resistance state and high resistance state. The cross-point arrays described here can be used in the memory die 292 of FIG. 4, the local memory 106 in FIG. 1, and/or the host memory 124 in FIG. 1. Resistive type memory cells can be formed according to many of the technologies mentioned above, such as ReRAM, PCM, FeRAM, or MRAM. The following discussion is presented mainly in the context of memory arrays using a cross-point architecture with binary valued MRAM memory cells, although much of the discussion is more generally applicable.

Figure 8:
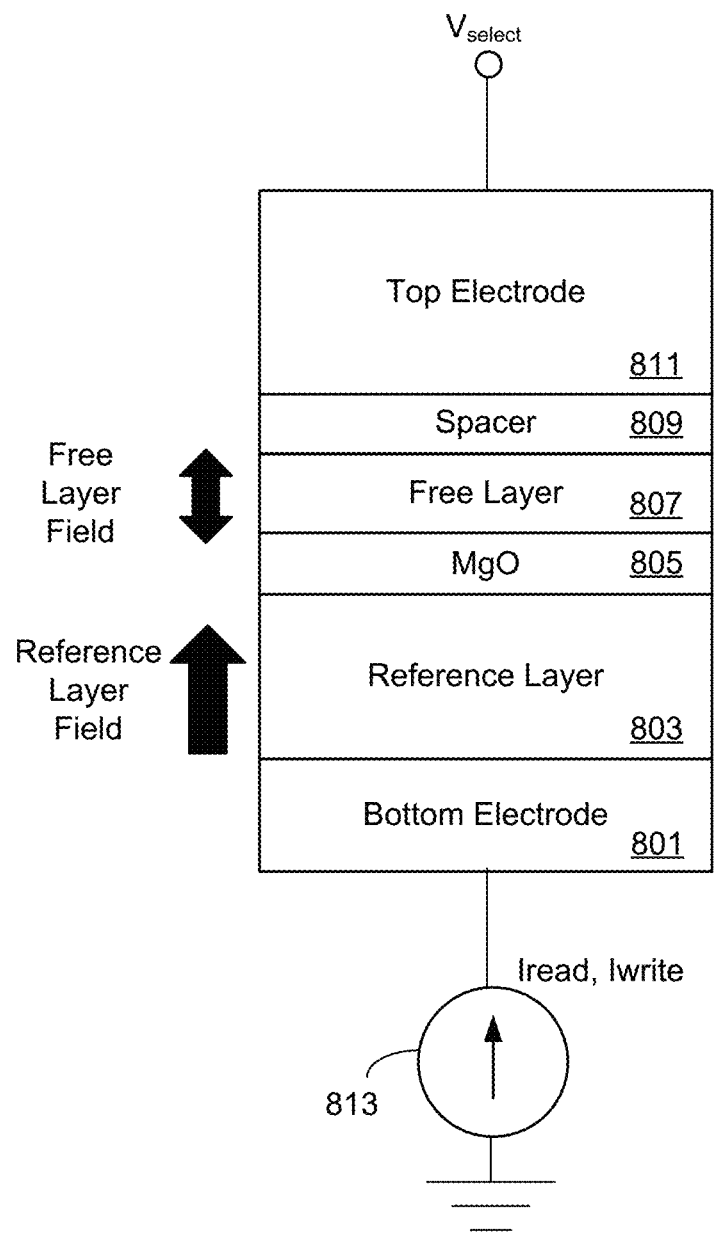
FIG. 8 illustrates an embodiment for the structure of an MRAM memory cell.

FIG. 8 illustrates an embodiment for the structure of an MRAM cell. The MRAM cell includes a bottom electrode 801, a pair of magnetic layers (reference layer 803 and free layer 807) separated by a separation or tunneling layer of, in this example, magnesium oxide (MgO) 805, and then a top electrode 811 separated from the free layer 807 by a spacer 809. In another embodiment, the locations of the reference layer 803 and free layer 807 are switched, with the reference layer 803 on top of MgO 805, and the free layer 807 below MgO 805. In some embodiments, the bottom electrode 801 is referred to as a word line and the top electrode 811 is referred to as a bit line. In other embodiments, the bottom electrode 801 is referred to as a bit line and the top electrode 811 is referred to as a word line. The state of the memory cell is based on the relative orientation of the magnetizations of the reference layer 803 and the free layer 807: if the two layers are magnetized in the same direction, the memory cell will be in a parallel (P) low resistance state (LRS); and if they have the opposite orientation, the memory cell will be in an anti-parallel (AP) high resistance state (HRS). An MLC embodiment would include additional intermediate states. The orientation of the reference layer 803 is fixed and, in the example of FIG. 8, is oriented upward. Reference layer 803 is also known as a fixed layer or pinned layer.

Data is written to an MRAM memory cell by programming the free layer 807 to either have the same orientation or opposite orientation. An array of MRAM memory cells may be placed in an initial, or erased, state by setting all of the MRAM memory cells to be in the low resistance state in which all of their free layers have a magnetic field orientation that is the same as their reference layers. Each of the memory cells is then selectively programmed (also referred to as "written") by placing its free layer 807 to be in the high resistance state by reversing the magnetic field to be opposite that of the reference layer 803. The reference layer 803 is formed so that it will maintain its orientation when programming the free layer 807. The reference layer 803 can have a more complicated design that includes synthetic anti-ferromagnetic layers and additional reference layers. For simplicity, the figures and discussion omit these additional layers and focus only on the fixed magnetic layer primarily responsible for tunneling magnetoresistance in the cell.

In the embodiment of FIG. 8, a forced current approach is used to access the MRAM cell. The forced current approach may be used to read or write the MRAM cell. In the forced current approach, an access current (e.g., $I_{read}$ or $I_{write}$) is driven through the bottom electrode 801 by a current source 813. The current source 813 is a part of the driver circuitry for the bottom electrode 801. A voltage (e.g., $V_{select}$) is provided to the top electrode 811. An access current is driven through a portion of a first conductive line (e.g., word line), through a selected memory cell, and through a portion of a second conductive line (e.g., bit line). There will be a voltage difference between the first and second conductive line as the access current flows. There will typically be some IR drop along the conductive lines, so this voltage difference may depend on the location of the conductive lines. For example, the voltage difference where the selected memory cell connects to the conductive lines will typically be different from the voltage difference between the ends of the conductive lines. Herein, the terms "read current" ($I_{read}$) and "write current" ($I_{write}$) will be used in connection with access currents that are driven through MRAM cells. The write current will change the state of the MRAM cell. As an example, a write current of about 30 uA may be used for an MRAM cell with a Critical Dimension (CD) of approximately 20 nanometers with RA10Ω·μm². Read currents may be about half the write current if applied for a limited time, such as <30 ns. A write current that flows in one direction through the MRAM cell will change an AP-state MRAM cell from the AP-state to the P-state. A write current that flows in the other direction through the MRAM cell will change a P-state MRAM cell from the P-state to the AP-state. In general, a read current will preferably be set low enough so as not to change the state of an MRAM cell from the P-state to the AP-state or from the AP-state to the P-state.

As defined herein, the access current may have a positive magnitude (or direction) or a negative magnitude. A positive magnitude access current that is driven through a first conductive line (e.g., word line) at a given point will flow in the opposite direction as a negative magnitude access current that is driven through the first conductive line at the given point. Hence, the access current may flow through the MRAM cell in either direction, depending on the whether the access current is defined as having a positive or negative magnitude. FIG. 8 depicts the current flowing in a positive direction, but the current could flow in the opposite (negative) direction.

As discussed more fully below in connection with FIG. 10A, in some embodiments, a read current may be applied in an AP2P direction or, alternatively, in a P2AP direction. In some embodiments, the MRAM cell is read by performing an SRR (self-referenced-read). In one embodiment, an SRR has a first read (Read1 in the AP2P direction), a write to the P-state, and a second read (Read2 in the AP2P direction). The voltage level of the memory cell due to Read1 in the AP2P direction is stored, for example on a capacitor; or by conversion to digital bits by an Analog to Digital converter and the bits stored in memory, for example in SRAM until after use in Read2. The sensed voltage level due to Read2 in the AP2P direction (after a write) is compared with the voltage level due to Read1 in the AP2P direction. An adequate change in the voltage level, for example more than 100 mV indicates that the MRAM cell was originally in the AP-state. If the change in voltage is less than 100 mV, the MRAM cell was originally in the P state. Alternatively, the SRR has a first read (Read1 in the P2AP direction), a write to the AP-state, and a second read (Read2 in the P2AP direction). The voltage level of the memory cell due to Read1 in the P2AP direction is stored. The voltage level due to Read2 in the P2AP direction is compared with the voltage level due to Read1 in the P2AP direction. An adequate change in the voltage level indicates that the MRAM cell was originally in the P-state. In some embodiments, the same polarity is used for Read1 and Read2, which avoids switching the selector off between Read1 and Read2.

In one embodiment, the MRAM cell is read by applying, for example, 0V to the top electrode 811, while driving a current of, for example, 15 micro-Amperes (μA) through the bottom electrode 801. This read current will flow from the bottom electrode 801 to the top electrode 811. Note that the read may be Read1 or Read2 in the P2AP direction. In some embodiments, data is written to the MRAM cell using a bipolar write operation. In one embodiment, the MRAM cell is written from the AP-state to the P-state by applying, for example, 3V to the top electrode 811, while driving a write current of, for example, −30 μA through the bottom electrode 801. This write current will flow from the top electrode 811 to the bottom electrode 801. In one embodiment, the MRAM cell is written from the P-state to the AP-state by applying, for example, 0V to the top electrode 811, while driving a current of, for example, 30 μA through the bottom electrode 801. This write current will flow from the bottom electrode 801 to the top electrode 811.

As an alternative to the approach in FIG. 8, the select voltage can be applied to the bottom electrode 801, with the access current applied through the top electrode 811. In one such embodiment, the MRAM cell is read by applying, for example, 3V to the bottom electrode 801, while driving a read current of, for example, −15 μA through the top electrode 811. This read current will flow from the bottom electrode 801 to the top electrode 811.

In one embodiment, the MRAM cell is written from the AP-state to the P-state by applying, for example, −3V to the bottom electrode 801, while driving a write current of, for example, 30 μA through the top electrode 811. The electron current will flow from the bottom electrode 801 to the top electrode 811. In one embodiment, the MRAM cell is written from the P-state to the AP-state by applying, for example, 0V to the bottom electrode 801, while driving a current of, for example, −30 μA through the top electrode 811. The electron current will flow from the top electrode 811 to the bottom electrode 801.

Figure 9:
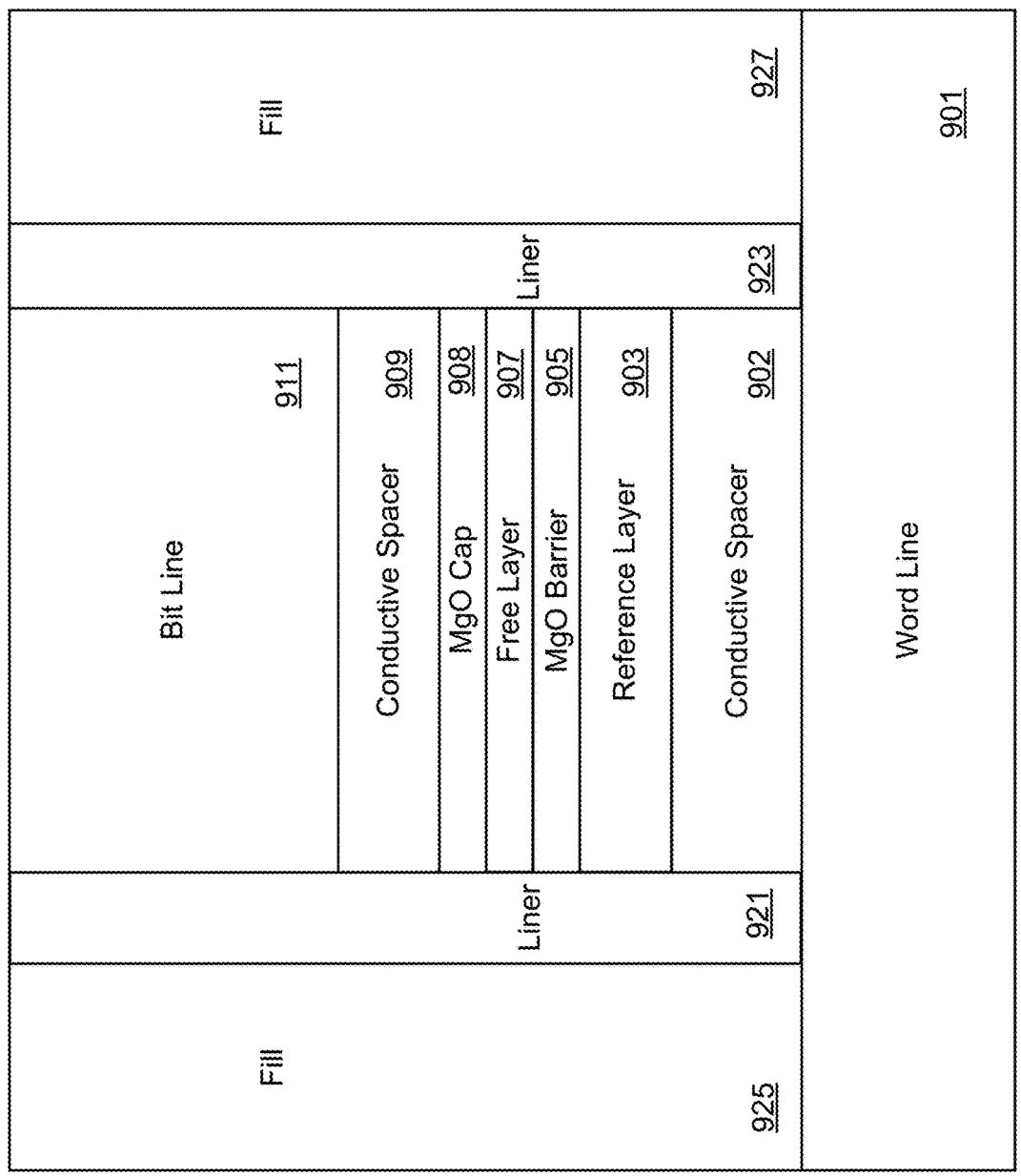
FIG. 9 illustrates an embodiment for an MRAM memory cell design as it would be implemented in a cross-point array in more detail.

FIG. 9 illustrates an embodiment for an MRAM memory cell design as it may be implemented in a cross-point array in more detail. When placed in a cross-point array, the top and bottom electrodes of the MRAM memory cells will be the top and bottom wires of the array. In the embodiment shown here, the bottom electrode is the word line 901 and the top electrode is the bit line 911 of the memory cell, but these can be reversed in some embodiments. Between the word line 901 and bit line 911 are the reference layer 903 and free layer 907, which are again separated MgO barrier 905. In the embodiment shown in FIG. 9, an MgO cap 908 is also formed on top of the free layer 907 and a conductive spacer 909 is formed between the bit line 911 and the MgO cap 908. The reference layer 903 is separated from the word line 901 by another conductive spacer 902. On either side of the memory cell structure is a liner 921 and 923, where these can be part of the same structure, but appear separate in the cross-section of FIG. 9. To either side of the liner 921, 923 is shown some of fill material 925, 927 used to fill in the otherwise empty regions of the cross-point structure.

With respect to the free layer design 907, embodiments include CoFe or CoFeB Alloy with a thickness on the order ~1-2 nm, where an Ir layer can be interspersed in the free layer close to MgO barrier 905 and the free layer 907 can be doped or interspersed with Ta, W, or Mo. Embodiments for the reference layer 903 can include a bilayer of CoFeB and CoPt multilayer coupled with an Ir or Ru spacer 902. The MgO cap 908 is optional but can be used to increase anisotropy of free layer 907. The conductive spacers can be conductive metals such as Ta, W, Ru, CN, TiN, and TaN, among others.

The following discussion will mainly be discussed with respect to a perpendicular spin transfer torque MRAM memory cell, where the free layer 807/907 of FIGS. 8 and 9 comprises a switchable direction of magnetization that is perpendicular to the plane of the free layer. Spin transfer torque ("STT") is an effect in which the orientation of a magnetic layer in a magnetic tunnel junction (MJT) can be modified using a spin-polarized current. Charge carriers (such as electrons) have a property known as spin which is a small quantity of angular momentum intrinsic to the carrier. An electric current is generally unpolarized (e.g., consisting of 50% spin-up and 50% spin-down electrons). A spin polarized current is one with more electrons of either spin (e.g., a majority of spin-up electrons or a majority of spin-down electrons). By passing a current through a thick magnetic layer (the reference layer), a spin-polarized current can be produced. If this spin-polarized current is directed into a second magnetic layer (the free layer), angular momentum can be transferred to this second magnetic layer, changing the direction of magnetization of the second magnetic layer. This is referred to as spin transfer torque. FIGS. 10A and 10B illustrate the use of spin transfer torque to program or write to MRAM memory. Spin transfer torque magnetic random access memory (STT MRAM) has the advantages of lower power consumption and better scalability over other MRAM variations. Compared to other MRAM implementations, such as toggle MRAM, the STT switching technique requires relatively low power, virtually eliminates the problem of adjacent bit disturbs, and has more favorable scaling for higher memory cell densities (reduced MRAM cell size). The latter issue also favors STT MRAM where the free and reference layer magnetizations are orientated perpendicular to the film plane, rather than in-plane.

As the STT phenomenon is more easily described in terms electron behavior, FIGS. 10A and 10B and their discussion is given in terms of electron current, where the direction of the write current is defined as the direction of the electron flow. Therefore, the term write current in reference to FIGS. 10A and 10B refers to an electron current. As electrons are negatively charged, the electron current will be in the opposite direction from the conventionally defined current, so that an electron current will flow from a lower voltage level towards a higher voltage level instead the conventional current flow of from a higher voltage level to a lower voltage level.

FIGS. 10A and 10B illustrate the writing of an MRAM memory cell by use the STT mechanism, depicting a simplified schematic representation of an example of an STT-switching MRAM memory cell 1000 in which both the reference and free layer magnetization are in a perpendicular direction. Memory cell 1000 includes a magnetic tunnel junction (MTJ) 1002 comprising an upper ferromagnetic layer 1010, a lower ferromagnetic layer 1012, and a tunnel barrier (TB) 1014 as an insulating layer between the two ferromagnetic layers. In this example, upper ferromagnetic layer 1010 is the free layer FL and the direction of its magnetization can be switched. Lower ferromagnetic layer 1012 is the reference (or fixed) layer RL and the direction of its magnetization cannot be switched. When the magnetization in free layer 1010 is parallel to the magnetization in reference layer RL 1012, the resistance across the memory cell 1000 is relatively low. When the magnetization in free layer FL 1010 is anti-parallel to the magnetization in reference layer RL 1012, the resistance across memory cell 1000 is relatively high. The data ("0" or "1") in memory cell 1000 is read by measuring the resistance of the memory cell 1000. In this regard, electrical conductors 1006/1008 attached to memory cell 1000 are utilized to read the MRAM data. By design, both the parallel and antiparallel configurations remain stable in the quiescent state and/or during a read operation (at sufficiently low read current).

For both the reference layer RL 1012 and free layer FL 1010, the direction of magnetization is in the perpendicular direction (i.e. perpendicular to the plane defined by the free layer and perpendicular to the plane defined by the reference layer). FIGS. 10A and 10B show the direction of magnetization of reference layer RL 1012 as up and the direction of magnetization of free layer FL 1010 as switchable between up and down, which is perpendicular to the plane.

In one embodiment, tunnel barrier 1014 is made of Magnesium Oxide (MgO); however, other materials can also be used. Free layer 1010 is a ferromagnetic metal that possess the ability to change/switch its direction of magnetization. Multilayers based on transition metals like Co, Fe and their alloys can be used to form free layer 1010. In one embodiment, free layer 1010 comprises an alloy of Cobalt, Iron and Boron. Reference layer 1012 can be many different types of materials including (but not limited to) multiple layers of Cobalt and Platinum and/or an alloy of Cobalt and Iron.

To "set" the MRAM memory cell bit value (i.e., choose the direction of the free layer magnetization), an electron current 1050 is applied from conductor 1008 to conductor 1006, as depicted in FIG. 10A (hence current flows in the opposite direction). To generate the electron current 1050, the top conductor 1006 is placed at a higher voltage level than bottom conductor 1008, due the negative charge of the electron. The electrons in the electron current 1050 become spin-polarized as they pass through reference layer 1012 because reference layer 1012 is a ferromagnetic metal. When the spin-polarized electrons tunnel across the tunnel barrier 1014, conservation of angular momentum can result in the imparting of a spin transfer torque on both free layer 1010 and reference layer 1012, but this torque is inadequate (by design) to affect the magnetization direction of the reference layer 1012. Contrastingly, this spin transfer torque is (by design) sufficient to switch the magnetization orientation in the free layer 1010 to become parallel (P) to that of the reference layer 1012 if the initial magnetization orientation of the free layer 1010 was anti-parallel (AP) to the reference layer 1012, referred to as an anti-parallel-to-parallel (AP2P) write. The parallel magnetizations will then remain stable before and after such electron current is turned off.

In contrast, if free layer 1010 and reference layer 1012 magnetizations are initially parallel, the direction of magnetization of free layer 1010 can be switched to become antiparallel to the reference layer 1012 by application of an electron current of opposite direction to the aforementioned case. For example, electron current 1052 is applied from conductor 1006 to conductor 1008, as depicted in FIG. 10B, by placing the higher voltage level on the lower conductor 1008. This will write a free layer 1010 in a P state to an AP state, referred to as a parallel-to-anti-parallel (P2AP) write. Thus, by way of the same STT physics, the direction of the magnetization of free layer 1010 can be deterministically set into either of two stable orientations by judicious choice of the electron current direction (polarity).

The data ("0" or "1") in memory cell 1000 can read by measuring the resistance of the memory cell 1000. Low resistance typically represents a "0" bit and high resistance typically represents a "1" bit, although sometimes the alternate convention occurs. A read current can be applied across the memory cell (e.g., across the MJT 1002) by applying an electron current from conductor 1008 to conductor 1006, flowing as shown for 1050 in FIG. 10A (the "AP2P direction"); alternatively, the electron current can be applied from conductor 1006 to conductor 1008, flowing as shown for 1052 in FIG. 10B (the "P2AP direction"). As is well-understood, the electron current flows in the opposite direction as conventionally defined current. In a read operation, if the electron current is too high, this can disturb data stored in a memory cell and change its state. For example, if electron current Read1 uses the P2AP direction of FIG. 10B, too high of a current or voltage level can switch any memory cells in the low resistance P state into the high resistance AP state before the bit voltage during Read1 is stored. Consequently, although the MRAM memory cell can be read in either direction, the directional nature of the write operation may make one read direction preferable over the other in various embodiments. For example, for a given read current, the error rate may be less doing SRR in the P2AP direction.

Although the discussion of FIGS. 10A and 10B was in the context of electron current for the read and write currents, the subsequent discussion will be in the context of conventional current unless otherwise specified.

Whether to read or write selected memory cells in the array structures of FIGS. 7A-7D, the bit line and word line corresponding a selected memory cell is biased to place a voltage across the selected memory cell and induce the flow of electrons as illustrated with respect to FIG. 10A or 10B. Note that in some embodiments, the word line is biased by driving a current through at least a portion of the word line. This will also apply a voltage across non-selected memory cells of the array, which can induce currents in non-selected memory cells. Although this wasted power consumption can be mitigated to some degree by designing the memory cells to have relatively high resistance levels for both high and low resistance states, this will still result in increased current and power consumption as well as placing additional design constraints on the design of the memory cells and the array. Note that herein, a "selected memory cell" means that the memory cell is selected for access (e.g., read access, write access). An "unselected memory cell" means that the memory cell is not selected for access. A given process may result in write currents that are about the same for forward versus reverse write of the MRAM, or it may be that writing from low resistance state (LRS) to high resistance state (HRS) requires about 20% more current for CD of approximately 20 nm and RA10 $\Omega \cdot cm^2$.

One approach to address this unwanted current leakage is to place a selector element in series with each MRAM or other resistive (e.g., ReRAM, PCM) memory cell. For example, a select transistor can be placed in series with each resistive memory cell element in FIGS. 7A-7D so that the memory cells 701 is now a composite of a select transistor and a programmable resistance. Use of a select transistor, however, requires the introduction of additional control lines and cell area to be able to turn on the corresponding transistor of a selected memory cell. Additionally, transistors will often not scale in the same manner as the resistive memory element, so that as memory arrays move to smaller sizes the use of transistor based selectors can be a limiting factor.

An alternate approach to select transistors is the use of a threshold switching selector in series with the programmable resistive element. A threshold switching selector has a high resistance (in an off or non-conductive state) when it is biased to a voltage lower than its threshold voltage, and a low resistance (in an on or conductive state) when it is biased to a voltage higher than its threshold voltage. The threshold switching selector remains on until its current is lowered below a holding current Ihold, or the voltage is lowered below a holding voltage, Vhold. When this occurs, the threshold switching selector returns to the off state. Accordingly, to program a memory cell at a cross-point, a voltage is applied which is sufficient to turn on the associated threshold switching selector and set or reset the memory cell; and to read a memory cell, the threshold switching selector similarly must be activated by being turned on before the resistance state of the memory cell can be determined. One set of examples for a threshold switching selector is an ovonic threshold switching material of an Ovonic Threshold Switch (OTS). Example threshold switching materials include Ge—Se, Ge—Se—N, Ge—Se—As, Ge—Se—Sb—N, Ge58Se42, $GeTe_6$, Si—Te, Zn—Te, C—Te, B—Te, Ge—As—Te—Si—N, Ge—As—Se—Te—Si and Ge—Se—As—Te, with atomic percentages ranging from a few percent to more than 90 percent for each element.

Figure 11A:
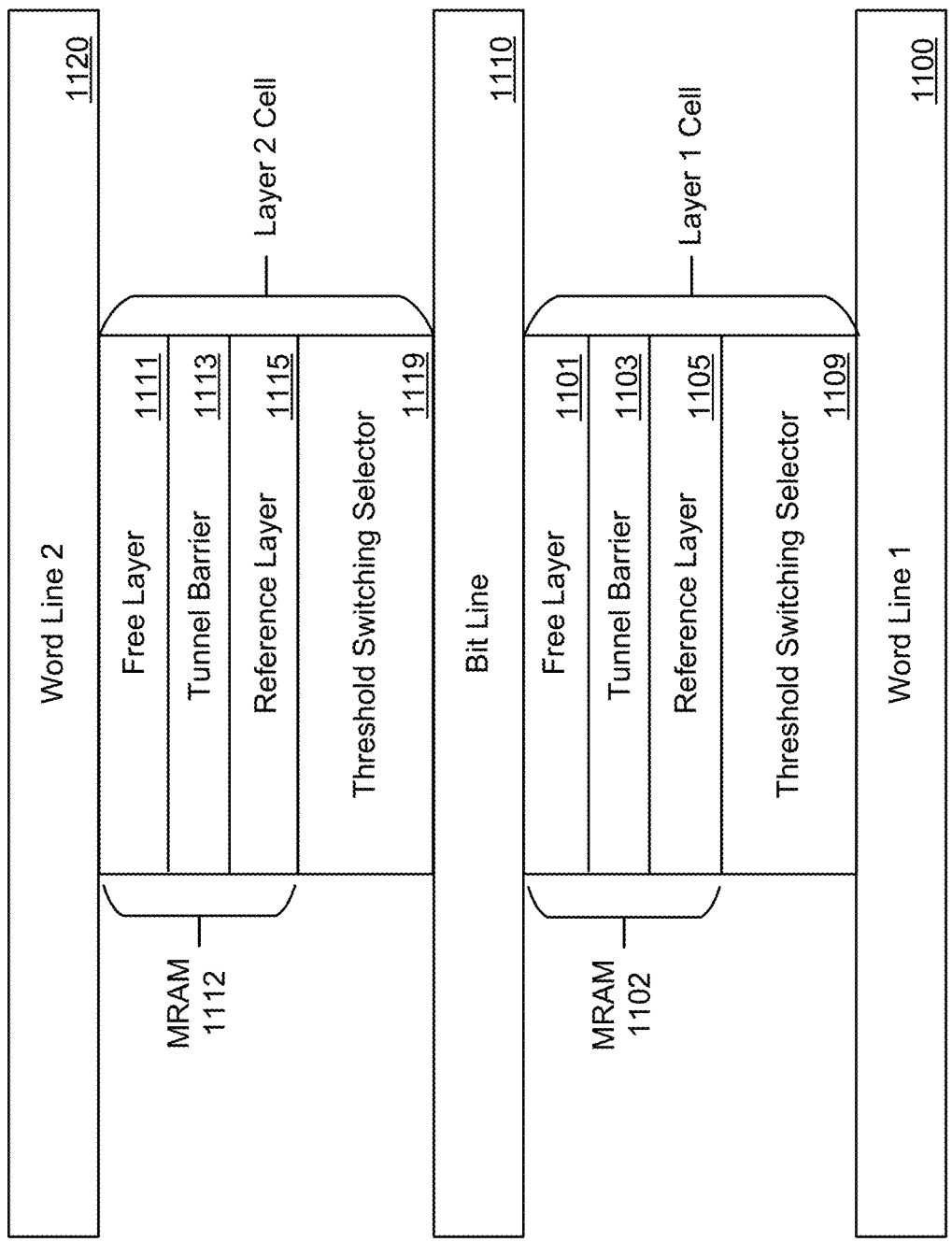
FIGS. 11A and 11B illustrate embodiments for the incorporation of threshold switching selectors into an MRAM memory array having a cross-point architecture.
Figure 11B:
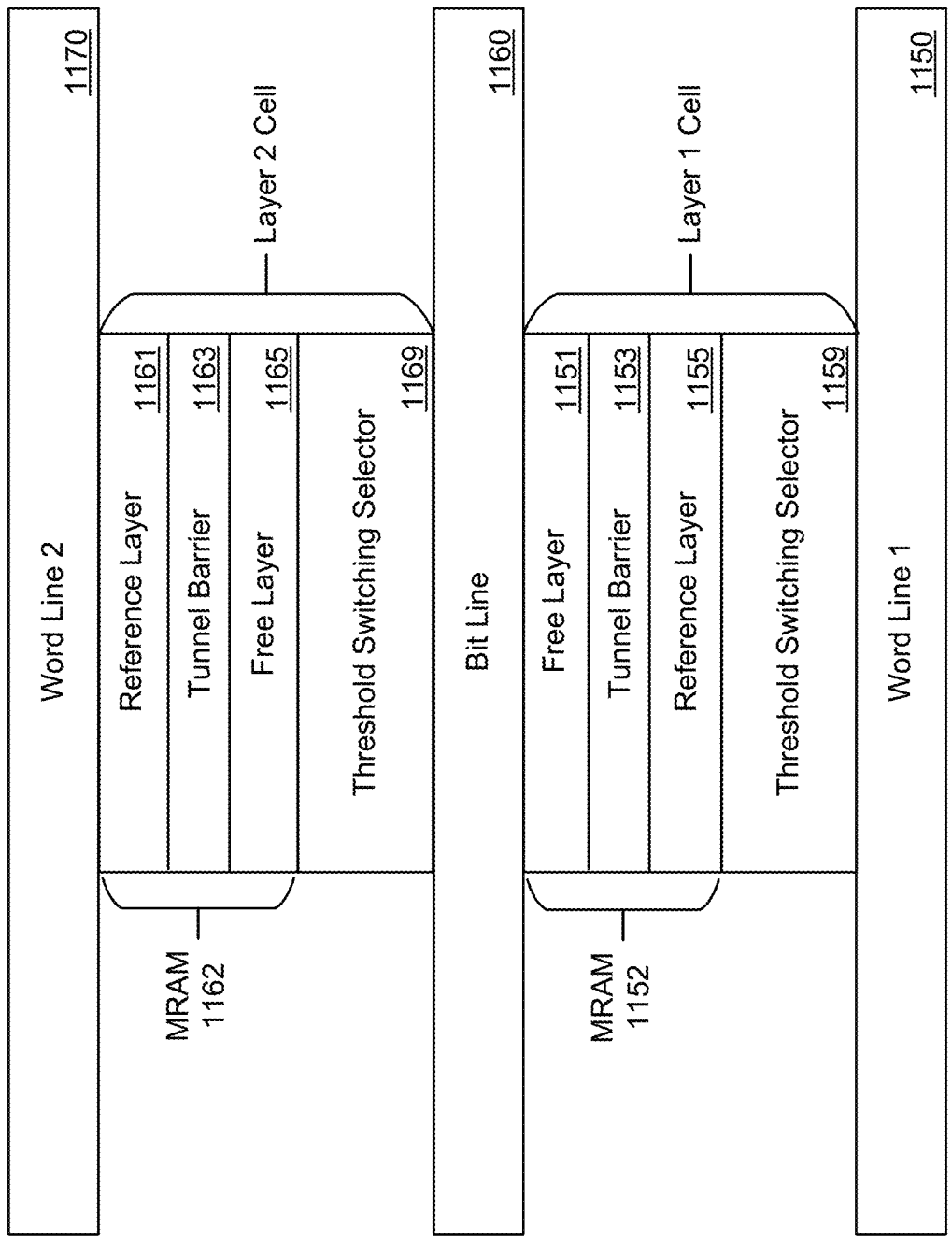

FIGS. 11A and 11B illustrate embodiments for the incorporation of threshold switching selectors into an MRAM memory array having a cross-point architecture. The examples of FIGS. 11A and 11B show two MRAM cells (Layer 1 Cell, Layer 2 Cell) in a two layer cross-point array, such as shown in FIG. 7D, but in a side view. FIGS. 11A and 11B show a lower first conducting line of word line 1 1100, an upper first conducting line of word line 2 1120, and an intermediate second conducting line of bit line 1110. In these figures, all of these lines are shown running left to right across the page for ease of presentation, but in a cross-point array they would be more accurately represented as in the oblique view of FIG. 7D where the word lines, or first conducting lines or wires, run in one direction parallel to the surface of the underlying substrate and the bit lines, or second conducting lines or wires, run in a second direction parallel to the surface to the substrate that is largely orthogonal to the first direction. The MRAM memory cells are also represented in a simplified form, showing only the reference layer, free layer, and the intermediate tunnel barrier, but in an actual implementation would typically include the additional structure described above with respect to FIG. 9.

An MRAM element 1102 including free layer 1101, tunnel barrier 1103, and reference layer 1105 is formed above the threshold switching selector 1109, where this series combination of the MRAM element 1102 and the threshold switching selector 1109 together form the layer 1 cell between the bit line 1110 and word line 1 1100. The series combination of the MRAM element 1102 and the threshold switching selector 1109 operate as largely as described above with respect to FIGS. 10A and 10B when the threshold switching selector 1109 is turned on, aside from some voltage drop across the threshold switching selector 1109. Initially, though, the threshold switching selector 1109 needs to be turned on by applying a voltage above the threshold voltage $V_{th}$ of the threshold switching selector 1109, and then the biasing current or voltage needs to be maintained high enough above the holding current or holding voltage of the threshold switching selector 1109 so that it stays on during the subsequent read or write operation.

On the second layer, an MRAM element 1112 includes free layer 1111, tunnel barrier 1113, and reference layer 1115 is formed above the threshold switching selector 1119, with the series combination of the MRAM element 1112 and the threshold switching selector 1119 together forming the layer 2 cell between the bit line 1110 and word line 2 1120. The layer 2 cell will operate as for the layer 1 cell, although the lower conductor now corresponds to a bit line 1110 and the upper conductor is now a word line, word line 2 1120. Additional paired layers may similarly share another bit line between them, having a pattern of WL1, BL1, WL2; WL3, BL2, WL4; or have separate bit lines in a pattern such as WL1, BL1, WL2, BL2.

In the embodiment of FIG. 11A, the threshold switching selector 1109/1119 is formed below the MRAM element 1102/1112, but in alternate embodiments the threshold switching selector can be formed above the MRAM element for one or both layers. As discussed with respect to FIGS. 10A and 10B, the MRAM memory cell is directional. In FIG. 11A, the MRAM elements 1102 and 1112 have the same orientation, with the free layer 1101/1111 above (relative to the unshown substrate) the reference layer 1105/1115. Forming the layers between the conductive lines with the same structure can have a number of advantages, particularly with respect to processing as each of the two layers, as well as subsequent layers in embodiments with more layers, can be formed according to the same processing sequence.

FIG. 11B illustrates an alternate embodiment that is arranged similarly to that of FIG. 11A, except that in the layer 2 cell the locations of the reference layer and free layer are reversed. More specifically, between word line 1 1150 and bit line 1160, as in FIG. 11A the layer cell 1 includes an MRAM element 1 having a free layer 1151 formed over tunnel barrier 1153, that is turn formed over the reference layer 1155, with the MRAM element 1152 formed over the threshold switching selector 1159. The second layer of the embodiment of FIG. 11B again has an MRAM element 1162 formed over a threshold switching selector 1169 between the bit line 1160 and word line 2 1170, but, relative to FIG. 11A, with the MRAM element 1162 inverted, having the reference layer 1161 now formed above the tunnel barrier 1163 and the free layer 1165 now under the tunnel barrier 1163. Alternatively, the configuration of MRAM cell 1162 may be used for the Layer 1 cell and the configuration of MRAM cell 1152 may be used for the Layer 2 cell.

Although the embodiment of FIG. 11B requires a different processing sequence for the forming of layers, in some embodiments it can have advantages. In particular, the directionality of the MRAM structure can make the embodiment of FIG. 11B attractive since when writing or reading in the same direction (with respect to the reference and free layers) the bit line will be biased the same for both the lower layer and the upper layer, and both word lines will be biased the same. For example, if both layer 1 and layer 2 memory cells are sensed in the P2AP direction (with respect to the reference and free layers), the bit line layer 1160 will be biased such as in the P2AP direction, the bit line 1160 is biased low (e.g., 0V) for both the upper and lower cell, with word line 1 1150 and word line 2 1170 both biased to a higher voltage level. Similarly, with respect to writing, for writing to the high resistance AP state the bit line 1160 is biased low (e.g., 0V) for both the upper and lower cell, with word line 1 1150 and word line 2 1170 both biased to a higher voltage level; and for writing to the low resistance P state the bit line 1160 is biased to the high voltage level, with word line 1 1150 and word line 2 1170 both biased to the low voltage level. In contrast, for the embodiment of FIG. 11A, the bit lines and word lines would need to have their bias levels reversed for performing any of these operations on the upper level relative to the lower level. Note that in one embodiment of a forced current approach the word lines are biased to a target voltage by driving a current through the word line.

To either read data from or write data to an MRAM memory cell involves passing a current through the memory cell. In embodiments where a threshold switching selector is placed in series with the MRAM element, before the current can pass through the MRAM element the threshold switching selector needs to be turned on by applying a sufficient voltage across the series combination of the threshold switching selector and the MRAM element and the current x resistive drops of the select transistor and array wires and power wires to the memory cell location.

Figure 12A:
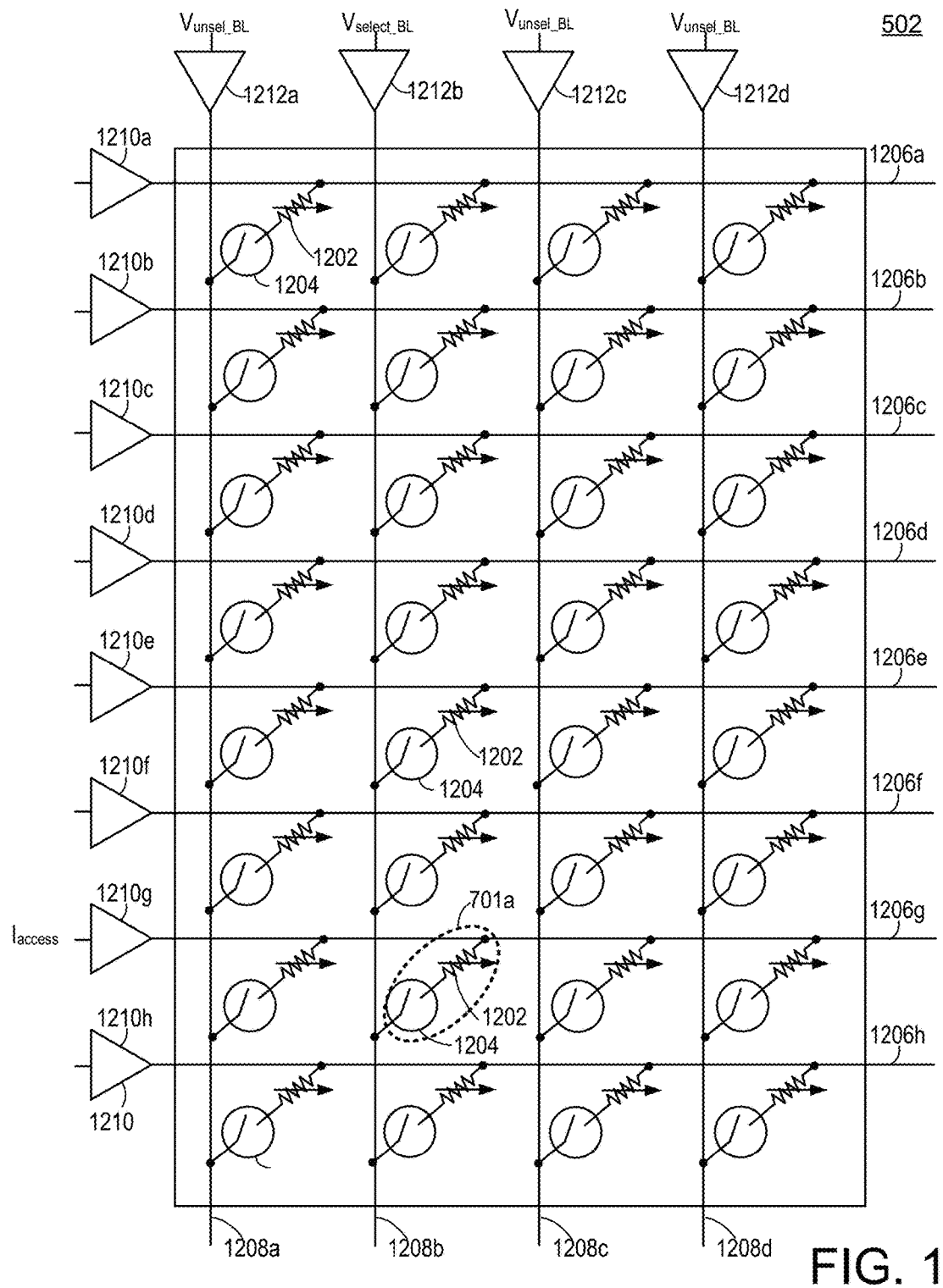
FIG. 12A depicts an embodiment of a memory array having a cross-point architecture.
Figure 12B:
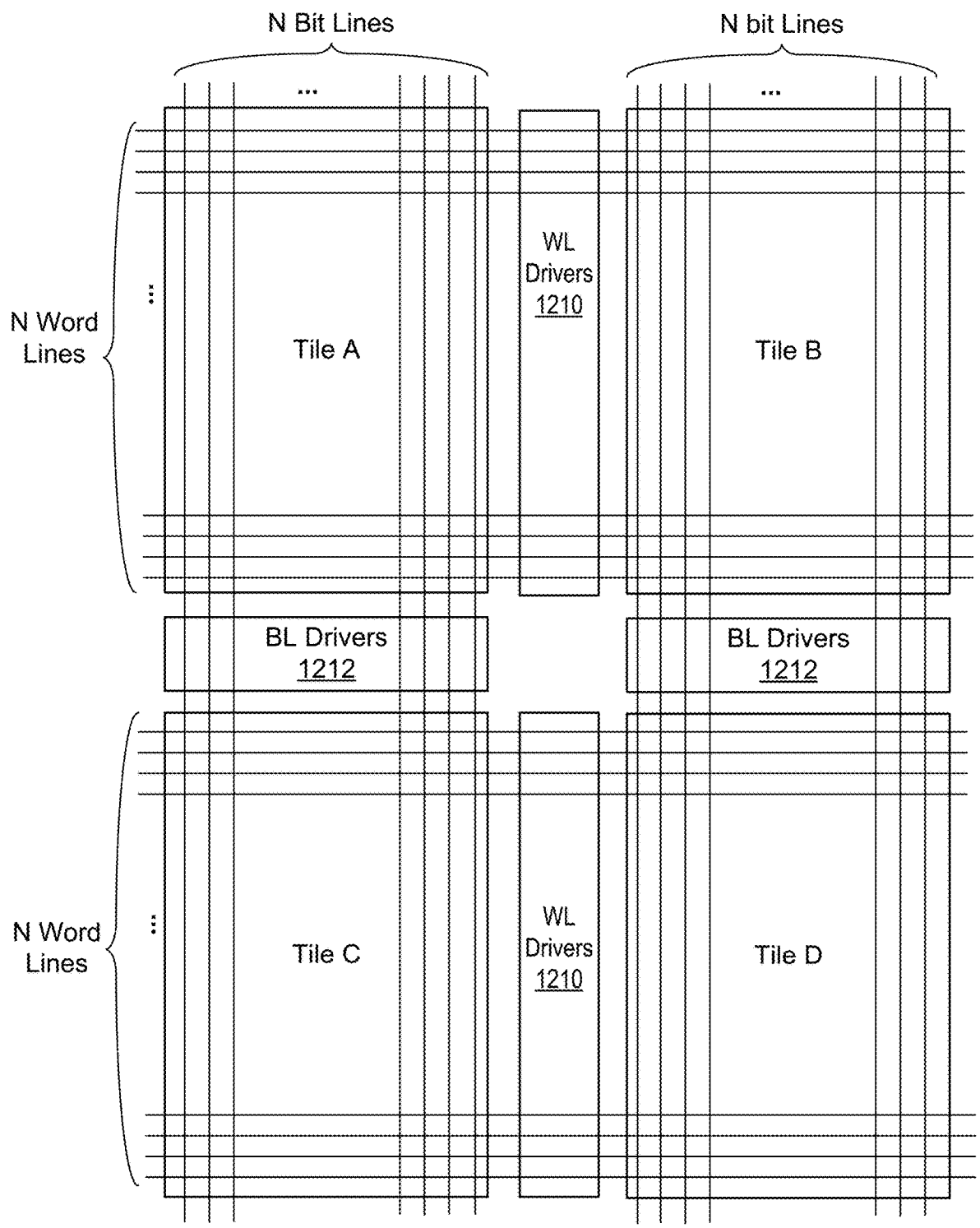
FIG. 12B depicts an embodiment of a module in a cross-point memory array.

FIG. 12A depicts an embodiment of a memory array 502 having a cross-point architecture. The array 502 has a set of first conductive lines 1206a-1206h and a set of second conductive lines 1208a-1208d. In one embodiment, the set of first conductive lines 1206a-1206h are word lines and the set of second conductive lines 1208a-1208b are bit lines. For ease of discussion, the set of first conductive lines 1206a-1206h may be referred to as word lines and the set of second conductive lines 1208a-1208b may be referred to as bit lines. However, the set of first conductive lines 1206a—1206h could be bit lines and the set of second conductive lines 1208a-1208b could be word lines.

The array 502 has a number of memory cells 701. Each memory cell 701 is connected between one of the first conductive lines 1206 and a corresponding one of the second conductive lines 1208. Each memory cell 701 has a magnetoresistive random access memory (MRAM) element 1202 in series with a threshold switching selector element 1204. Hence, each memory cell ("bit") 701 may be referred to as an MRAM cell or bit. The threshold switching selector 1204 is configured to become conductive in response to application of a voltage level exceeding a threshold voltage of the threshold switching selector 1204.

Each first conductive line 1206 may be driven by one of the WL drivers 1210a-1210h. For example, first conductive line 1206a may be driven by WL driver 1210a, first conductive line 1206b may be driven by WL driver 1210b, etc. Each second conductive line 1208 is driven by one of the BL drivers 1212a-1212d. For example, second conductive line 1208a is driven by BL driver 1212a, second conductive line 1208b is driven by BL driver 1212b, etc. In one embodiment, the word lines and the bit lines are driven from one end of the word line or bit line. FIG. 12A depicts such an embodiment in which the word lines and the bit lines are driven from one end. In an alternative embodiment, the bit lines and/or the word lines are driven from a midpoint. Driving a word line or bit line from a midpoint reduces the worst case IR drop.

Although a separate driver 1210 is depicted connected to each word line 1206, it is not required to have a separate driver 1210 for each word line. In one embodiment, the same driver can be used to provide the access current to whatever word line is presently selected. This driver may be connected to the selected word line by decode circuitry that selects the WL 1206 to be driven. The driver and decode circuity may be connected to a "global node" (see global node VX in FIG. 20). However, locations of WL drivers 1210a-1210h in FIG. 12A may still indicate the location (e.g., end) of the word line that is driven.

For purpose of discussion, memory cell 701a is being selected for access. This could be a read or a write access. Selected memory cell 701a is at the cross-point of selected word line 1206g and selected bit line 1208b. The other memory cells not selected for access (i.e., are unselected memory cells). All other word lines and all other bit lines are unselected by forcing them to an unselect voltage, such as Vmid, for example 1.65V, at approximately one half the drive compliance voltage, for example 3.3V. To select a memory cell 701, a select voltage ($V_{select\_BL}$) is provided to the selected bit line (e.g., bit line 1208b) and an access current is driven through a selected word line (e.g., word line 1206g). The access current may flow between a portion of the selected word line, through the selected memory cell, and through a portion of the selected bit line. An unselect voltage ($V_{unsel\_BL}$) is provided to the unselected bit lines (e.g., bit lines 1208a, 1208c, 1208d). In one embodiment, $V_{select\_BL}$ has a magnitude such that the threshold switching selector 1204 in a selected memory cell will turn on, for example approximately 0V. On the other hand, $V_{unsel\_BL}$ has a magnitude such that the threshold switching selector 1204 in an unselected memory cell will not turn on, for example 1.65V. Word line driver 1210g drives an access current ($I_{access}$) through at least a portion of selected word line 1206g. This access current may also flow through the selected memory cell 701a and in a portion of selected bit line 1208b. Such WL may, for example, be driven high by 15 ua to read or 30 ua to write by a current source with compliance voltage of, for example 3.3V, that may be adjusted (zoned) by memory cell position along the WL and BL to be either 3.1V if the memory cell is nearer the WL and BL drivers, or 3.3V if the memory cell position on the WL and BL is further away from the respective drivers on the WL and BL.

The WL drivers 1210 are configured to either source a current or sink a current. Thus, $I_{access}$ could flow in either direction through the selected word line (as well as the selected bit line). By convention used herein, when a current driver 1210 is used as a current source the magnitude of the access current is positive. By convention used herein, when a current driver 1210 is used as a current sink the magnitude of the access current is negative. Whether a current driver 1210 sources or sinks a current, herein this will be referred to as driving the current through the selected word line. In one embodiment, no current is driven through unselected word lines (e.g., 1206a, 1206b, 1206c, 1206d, 1206e, 1206f, and 1206h). Note that herein, a "selected word line" forced with, for example for a 20 nm CD, at 15 ua for read or 30 ua for write with voltage compliance of approximately 3.3 V, means that the word line is connected to a selected memory cell, such cell further determined by its connection to a "selected" bit line at approximately 0V. A selected word line may also be connected to unselected memory cells if the other cell terminal is connected to an unselected bit line at Vmid, such as 1.65V. An "unselected word line" means that the word line is connected to only unselected memory cells. In other words, all memory cells that connect to an unselected word line are unselected memory cells, for example when the unselected WL is forced at Vmid 1.65V; or when the unselected bit line is forced at Vmid 1.65V, for example. Note that herein, a "selected bit line" means that the bit line at, for example, 0V, is connected to at least one selected memory cell. An "unselected bit line" means that the bit line is connected to only unselected memory cells. In other words, all memory cells that connect to an unselected bit line are unselected memory cells. As noted above, a selected memory cell is a memory cell that is selected for access. A selected memory cell is connected between a selected word line and a selected bit line.

In the example of FIG. 12A there are more word lines than bit lines in the cross-point array. In one embodiment, there are more bit lines than word lines in the cross-point array. In one embodiment, the number of bit lines equals the number of word lines in the cross-point array. In the example of FIG. 12A there are twice as many word lines as bit lines in the cross-point array; however, a different ratio could be used. Thereby, different tile sizes may be realized. For example, a tile may have 1024 BL by 2048 WL, which may be composed into a module of 2048×4096 cells by center driving the WL and BL between the four tiles.

FIG. 12B depicts a module 1250 in a cross point memory array. The module has four tiles (Tile A, Tile B, Tile C, and Tile D). Each tile contains memory cells and may, in general, resemble the configuration depicted in FIG. 12A. Bit lines are shared between Tile A and Tile C. Bit lines are shared between Tile B and Tile D. The bit lines are driven from the center by the bit line drivers 1212. Word lines are shared between Tile A and Tile B. Word lines are shared between Tile C and Tile D. The word lines are driven from the center by the word line drivers 1210. In this example, there are "N" bit lines and "N" word lines per tile. As one example, N is 1024. However, N could be larger or smaller. Also, it is not required that the number of bit lines per tile is equal to the number of word lines per tile. Referring again to FIG. 12A, the array that is depicted could correspond to one tile of a module 1250, with the word lines being shared with another Tile and the bit lines being shared with another Tile. For example, the array in FIG. 12A could correspond to Tile D in FIG. 12B. However, the configuration in FIG. 12A is not required to be one tile of a module 1250.

In some embodiments, a forced current approach is used to access memory cells in a cross-point memory array. A forced current approach helps to automatically correct for IR drops due to word line resistance and/or bit line resistance. In some embodiments, threshold switching selectors are used in series with the memory cells. The switching selector is connected in series with the memory element between the word line and the bit line. Hence, any voltage across the switching selector will reduce the voltage across the memory element. Typically, there will be some variation in the offset voltage between the switching selectors. A forced current approach helps to automatically correct for offset voltage variation between threshold switching selectors.

Figure 13:
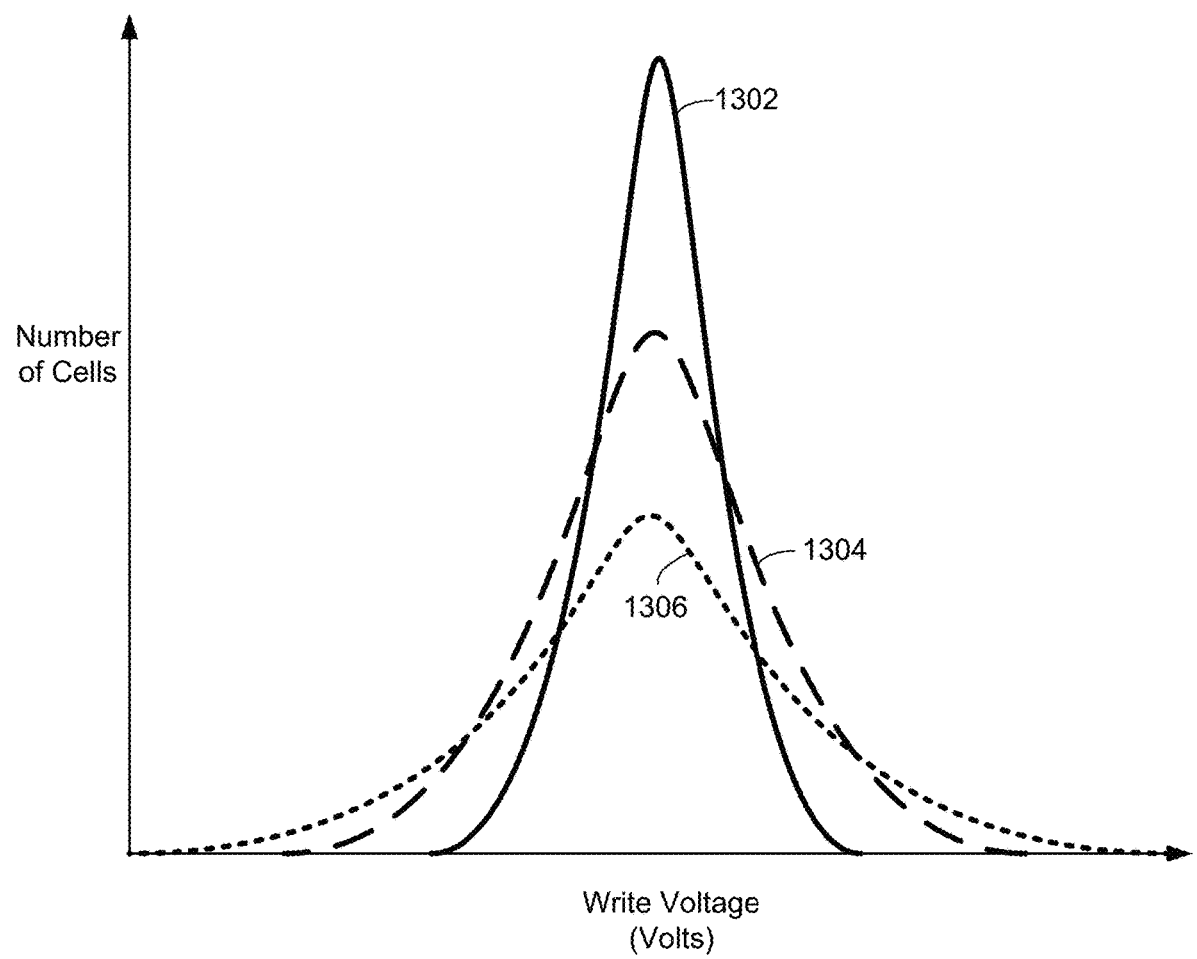
FIG. 13 depicts several plots of memory cell switching voltages.

FIG. 13 depicts several plots of memory cell switching voltages. The memory cell switching voltage is the voltage that needs to be applied across the combination of the switching selector and the memory element to switch the state of the memory element. Each plot is for the same set of memory cells, but for different assumptions about the switching selectors. For all three plots 1302, 1304, 1306 the switching selectors have the same average offset voltage. However, the standard deviation is different for each plot. Plot 1302 is for an ideal case in which there is no variation in offset voltage between the switching selectors. However, due to differences between the memory cells, there will still be some variation in switching voltages for the memory cells. For plot 1304 the offset voltage has a standard deviation of 1. For plot 1304 the offset voltage has a standard deviation of 2. Plots 1304 and 1306 demonstrate that a greater variation in the offset voltage between the switching selectors leads to a greater variation in switching voltage in the memory cells.

If a voltage source is used to write the memory cells, the write voltage will need to be high enough to account for the cases for which a high write voltage is needed to write the memory cell. It is possible that the write voltage might not be high enough for a few memory cells, but error correction circuitry can correct up to a certain number of errors. In order to keep the write error rate to a target error rate, the write voltage will need to be greater when there is a larger variation in offset voltage between the switching selectors.

However, a forced current approach to write the memory cells will not be impacted by the variation in offset voltage in the switching selectors. For example, if a fixed current is forced through the memory cell, then the voltage across the memory element is a function of the current and the resistance of the memory element. Thus, a forced current approach can reduce or eliminate write errors due to variation in offset voltage between the switching selectors. However, a forced current approach can potentially add stress to smaller diameter MRAM cells through applying higher voltage across the smaller memory elements with high resistance. In some embodiments, the selected word line voltage is clamped to a voltage limit while using a forced current approach, which reduces stress on memory cells.

Figure 14:
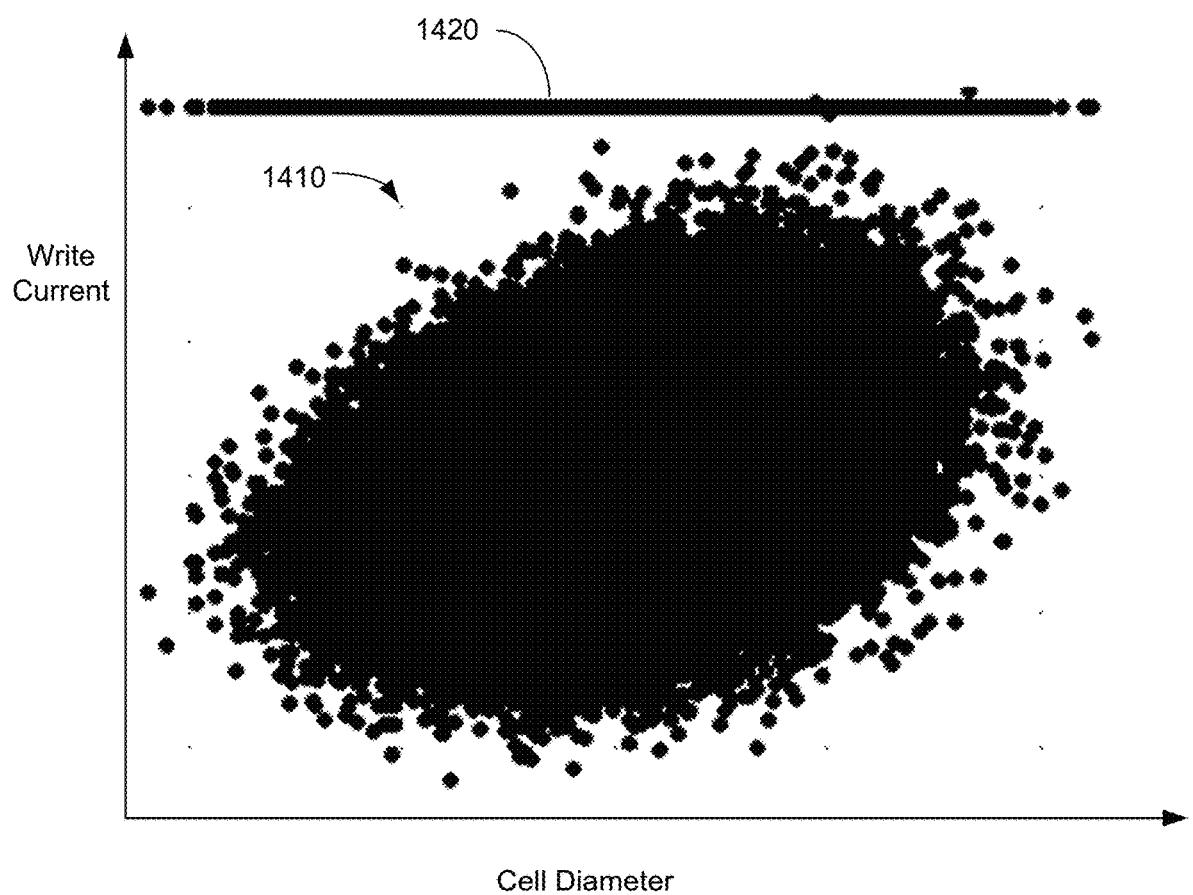
FIG. 14 depicts a scatterplot of required write current versus MRAM cell diameter.

FIG. 14 depicts a scatterplot of required write current versus MRAM cell diameter. The write current density of the MTJ in an MRAM cell may be roughly constant versus cell diameter. Therefore, the write voltage versus MRAM cell diameter may be roughly constant. However, the write current may scale with the MRAM cell diameter. The scatterplot 1410 shows that the amount of current that is required to write a MRAM cell may be a function of the cell diameter. In general, the smaller diameter MRAM cells can be written with a smaller current than the larger diameter MRAM cells. If the write current is not large enough then the memory cell might not switch from the AP-state to the P-state or from the P-state to the AP-state. If a memory cell does not switch states in response to application of the write current, this is referred to as a write failure. Line 1420 represents a magnitude for an example write current. The magnitude is set to be higher than the required write current for almost all the memory cells. However, a few memory cells could have a required write current that is greater than the write current 1420. The magnitude of the write current 1420 may be selected such that the likelihood of write failure is very low. The error correction engine in the memory system is able to correct some errors, hence a few write failures are permissible. That is, even if there are some write failures, the memory system will still be able to decode a codeword stored in the memory cells providing that the total number of errors is within a tolerance. The write current magnitude is thus set to be sufficiently high to keep the write failures within a tolerable amount. This magnitude will depend heavily on the memory cells having the largest diameter, as those cells have the highest required write current. However, the write current can also place stress on the smaller diameter memory cells.

Figure 15A:
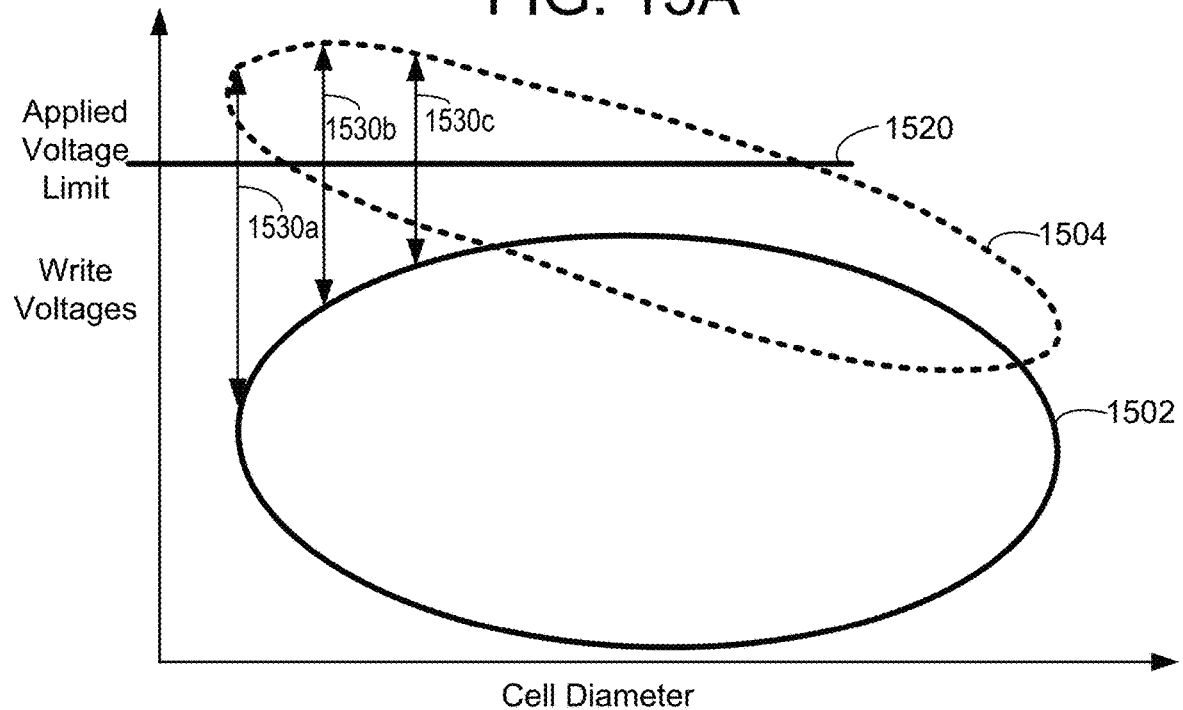
FIG. 15A is a graph depicting required write voltages versus MRAM cell diameter.

The requirements for writing an MRAM cell can also be viewed in terms of write voltage. FIG. 15A depicts required write voltages versus MRAM cell diameter. The region inside plot 1502 represents a distribution of required write voltage versus cell diameter for a group of memory cells. Note that the required write voltage does not significantly depend on the cell diameter. Thus, the region inside plot 1502 indicates required write voltages for memory cells of different diameters. Plot 1504 is for the actual voltage that will be applied across a memory cell given a target access current being forced through the memory cell. Plot 1504 is a distribution of the actual write voltage versus memory cell diameter. Note that the applied write voltage, when using forced current for memory access, does depend on the memory cell diameter. In particular, the applied write voltage increases as the memory cell diameter decreases. The write voltage may be expressed as follows.

$$V_{applied} = R * I_{access} \quad \text{Eq. 1}$$

In Equation 1, $I_{access}$ is the access current that is forced through the MRAM cell, and $V_{applied}$ is the voltage that appears across the MRAM cell. The MRAM cell resistance (R) increases as the cell diameter decreases. Therefore, $V_{applied}$ increases as the cell diameter decreases. However, the smaller diameter memory cells do not require such a high voltage for a successfully write operation. Hence, the smaller diameter memory cells may be over-stressed by $V_{applied}$. Three double-sided arrows 1530a, 1530b, and 1530c are depicted to indicate that the applied voltage can be significantly more than needed for some of the memory cells. Each double-sided arrow corresponds to one memory cell. Hence, the voltage over-stress of three representative memory cells are indicated in FIG. 15A.

Figure 15B:
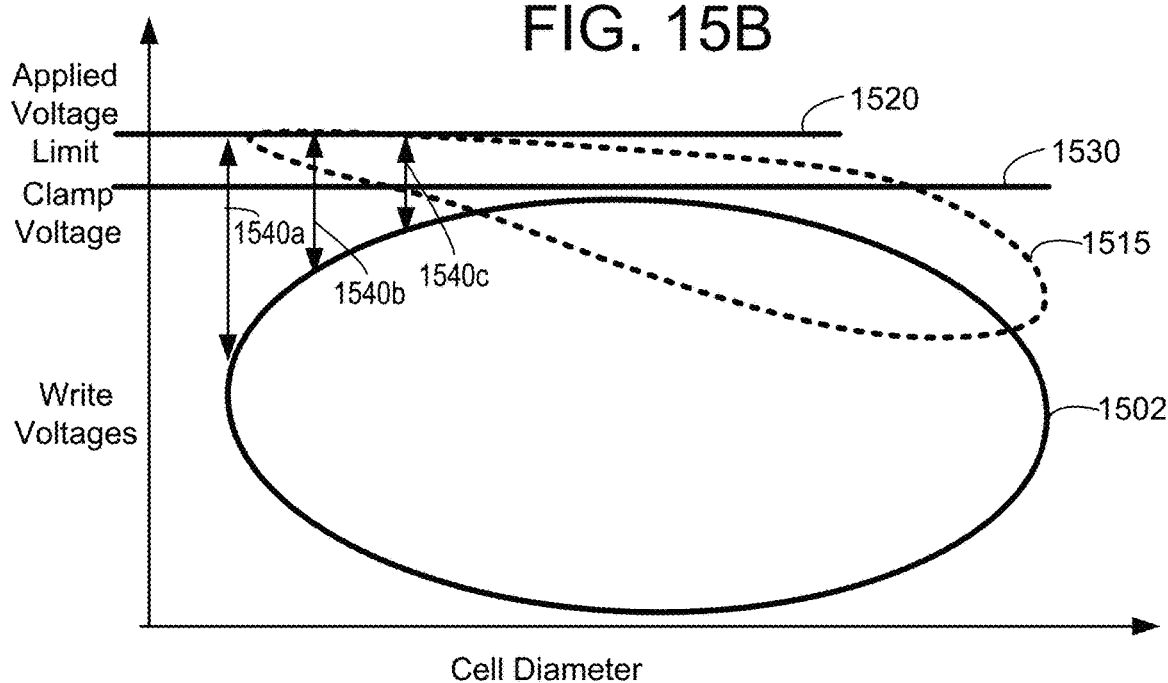
FIG. 15B is a graph depicting how voltage clamping may be used to reduce stress on memory cells.

In an embodiment, the voltage on the selected word line is clamped to a maximum allowed voltage while driving an access current through the selected memory cell. This helps to avoid stress on the selected memory cell while also permitting a sufficient voltage across the memory cell for read or write. Moreover, this reduces stress on the smaller diameter MRAM cells, which do not require a high write voltage. FIG. 15B depicts how voltage clamping may be used to reduce stress on memory cells. FIG. 15B again shows plot 1502. The voltage on the selected word line is clamped to an applied voltage limit 1520. In some embodiments, a select voltage is applied to the selected bit line while forcing the access current through the selected word line. If, for example, the bit line is grounded, the voltage on the selected word line is clamped to applied voltage limit 1520. If the bit line is held at a different value, then the voltage on the selected word line may be clamped to a suitable value to account for the bit line voltage.

Plot 1515 is for the actual voltage that will be applied across a memory cell given an access current being forced through the memory cell. Plot 1515 is a distribution of the actual write voltage versus memory cell diameter. None of the applied voltages for plot 1515 exceed the applied voltage limit. This is in contrast to plot 1504 (see FIG. 15A) in which some of the applied voltages exceed that level. Returning again to the discussion of FIG. 15B, three double-sided arrows 1540a, 1540b, and 1540c correspond to the same three example cells from FIG. 15A. The shorter length of double-sided arrows 1540a, 1540b, and 1540c (relative to 1530a, 1530b, and 1530c) indicates that the voltage stress on these memory cells has been significantly reduced, while still providing a sufficient write voltage to keep the error rate low (e.g., within an error correction capability).

FIG. 15B also depicts a voltage clamp level 1530. This refers to the voltage at a voltage clamp, which is not necessarily directly connected to the word line. Hence, the applied voltage limit 1520 could be slightly higher than the voltage at the voltage clamp.

Figure 16:
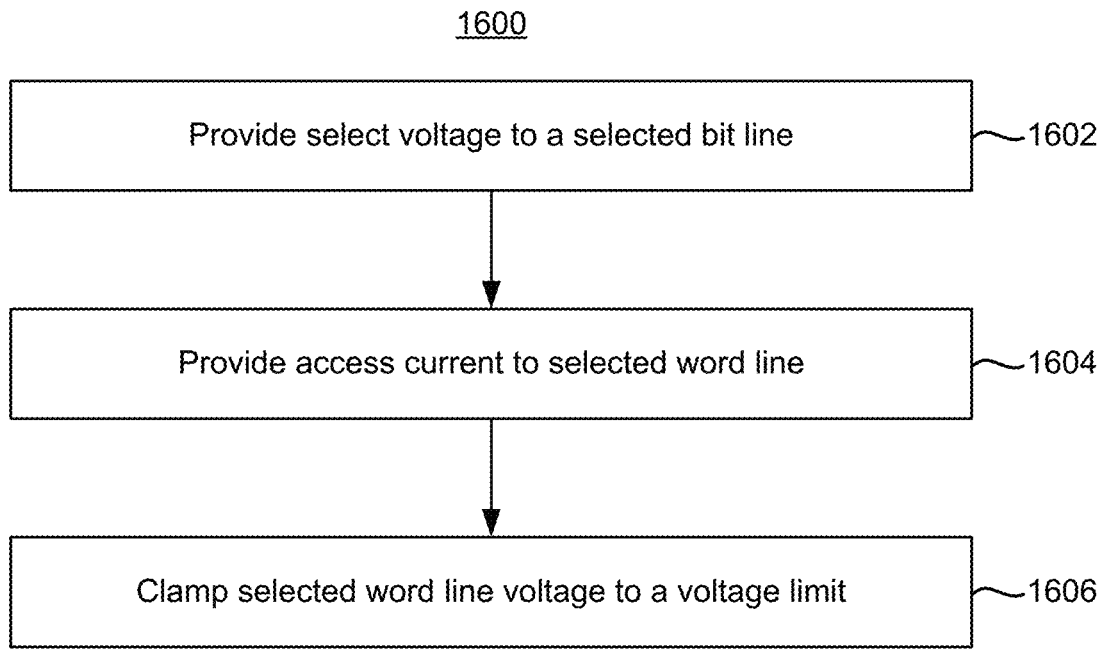
FIG. 16 depicts a flowchart of one embodiment of a process of clamping the selected word line voltage when using a forced current approach in a cross-point array.

In an embodiment, a voltage on a selected word line is clamped to a voltage limit while driving an access current through the selected word line. This helps to avoid stress on the selected memory cell. FIG. 16 depicts a flowchart of one embodiment of a process 1600 of clamping the selected word line voltage when using a forced current approach in a cross-point array. In an embodiment, the memory cells are MRAM cells. However, the memory cells are not required to be MRAM cells. In an embodiment, the memory cells have a memory element (e.g., MRAM element) in series with a selector (e.g., threshold switching selector). FIG. 12A will be referred to for purpose of illustration. The steps are described in a certain order as a matter of convenience of explanation. The steps are not required to be initiated in the order depicted in FIG. 16. Some or all of the steps could occur at the same time. In one embodiment, the process 1600 is performed by a control circuit in the memory die 292. In one embodiment, the process 1600 is performed by a control circuit in the control die 590. The control circuit may include, for example, system control logic 560, row control circuitry 520, and/or column control circuitry 510. In one embodiment, the process 1600 is performed by a control circuit (e.g., host processor 122) in the host system 120.

Step 1602 includes providing a select voltage to a selected bit line. With reference to FIG. 12A, Vselect is provided to the selected bit line 1208b. Unselect voltages are provided to the unselected bit lines.

Step 1604 includes providing an access current to a selected word line. With reference to FIG. 12A, $I_{access}$ is driven into the selected word line 1206g. Access currents are not provided to the unselected word lines. The access current may be a read current or a write current. The access current may flow through a portion of the selected word line, through the selected memory cell, and through a portion of the selected bit line. In particular, the access current may flow through the portion of the selected word line from where the word line is driven (by a current driver) to the selected memory cell. The access current may flow through the portion of the selected bit line from the selected memory cell to where the bit line is driven by the voltage driver.

Step 1606 includes clamping the maximum voltage on the selected word line voltage to a voltage limit. There may be an IR drop along the selected word line. Hence, in step 1606 the word line voltage being referred to is the maximum voltage on the selected word line. The voltage on the selected word line is clamped while the access current is provided to the selected word line and while the select voltage is provided to the selected bit line. Step 1606 thus limits the maximum voltage difference between the selected word line and the selected bit line to a voltage limit while forcing the access current through a portion of the selected first word line and a portion of the selected bit line. As noted, there can be IR drops along the selected word line and the selected bit line.

As noted in the discussion of step 1604, in one embodiment, the access current is a read current. In this case, a state of the memory cell (e.g., P-state, AP-state) may be determined in response to forcing the read current through the selected memory cell. As noted in the discussion of step 1604, in one embodiment, the access current is a write current. In this case, a state of the memory cell may be changed (e.g., from AP-state to P-state, or from P-state to AP-state) by forcing the write current through the selected memory cell. Numerous modifications to process 1600 are possible. In one embodiment, the roles of the word line and bit line are reversed. For example, the access current may be provided to the bit line.

Figure 17:
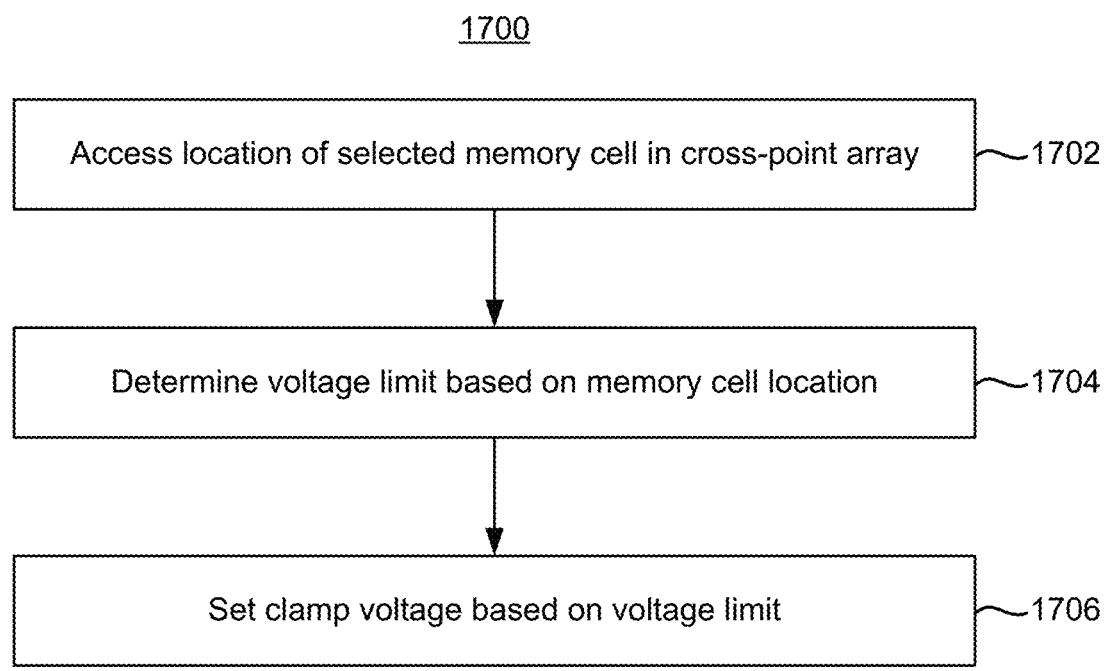
FIG. 17 depicts a flowchart of one embodiment of a process of clamping the maximum selected word line voltage to a voltage that depends on the location of the selected memory cell.

In some embodiments, the voltage limit depends on a location of the selected memory cell in the cross-point array. FIG. 17 depicts a flowchart of one embodiment of a process 1700 of clamping the maximum selected word line voltage to a voltage that depends on the location of the selected memory cell. In some embodiments, the selected memory cell is an MRAM cell. However, the selected memory cell is not required to be an MRAM cell. In an embodiment, the selected memory cell has a memory element (e.g., MRAM element) in series with a selector (e.g., threshold switching selector). In one embodiment, the process 1700 is performed by a control circuit in the memory die 292. In one embodiment, the process 1700 is performed by a control circuit in the control die 590. The control circuit may include, for example, system control logic 560, row control circuitry 520, and/or column control circuitry 510. In one embodiment, the process 1700 is performed by a control circuit (e.g., host processor 122) in the host 120.

Step 1702 includes accessing a location of the selected memory cell in the cross-point array. In one embodiment, the location is the address of the memory cell, which defines the word line and the bit line to which the memory cell is connected. In one embodiment, the location is a zone in which the memory cell resides. Further details of the zones are shown and described with respect to FIG. 19.

Step 1704 includes determining a voltage limit based on the location of the selected memory cell. In one embodiment, the voltage limit is based on resistances of a region of the selected word line in which the access current flows and a region of the selected bit line in which the access current flows.

Step 1706 includes setting a clamp voltage the voltage limit. In one embodiment, step 1706 includes sending a control signal to a voltage clamp. For example, the system control logic 560 may issue a control signal that results in a voltage being provided to a control gate of a voltage clamp. Further details of embodiments of the voltage clamp are shown and described with respect to FIGS. 21 and 22.

Figure 18:
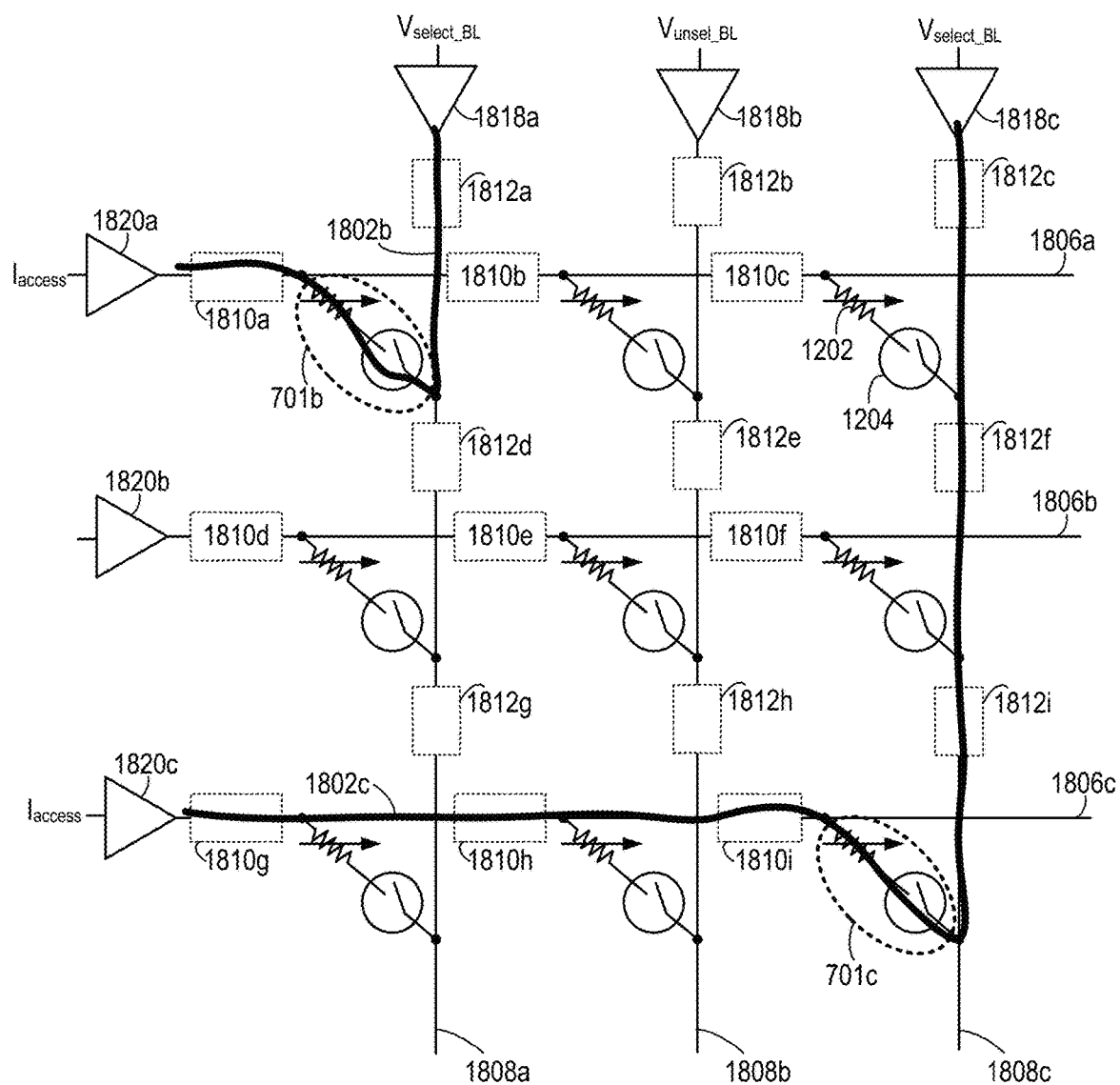
FIG. 18 is a schematic diagram of a portion of a cross-point array depicting track resistances associated with two different memory cells.

The location of the selected memory cell impacts the track resistance to that memory cell. In some embodiments, the magnitude of the voltage limit depends on track resistance in the cross-point array to the selected memory cell. FIG. 18 is a schematic diagram of a portion of a cross-point array 502 depicting track resistances to two different memory cells. Note that the two cells are not necessarily selected at the same time. Each word line can be broken down into separate segments that represent resistance for that segment. A number dotted boxes 1810a-1810i are depicted to represent these word line resistance segments. Likewise, each bit line can be broken down into separate segments that represent resistance for that segment. A number dotted boxes 1812a-1812i are depicted to represent these bit line resistance segments. Only a few word lines 1806a, 1806b, and 1806c are depicted for ease of illustration. Only a few bit lines 1808a, 1808b, and 1808c are depicted for ease of illustration. The locations of the word line drivers 1820a, 1820b, and 1820c, relative to the ends of the word lines, are depicted. The locations of the bit line drivers 1818a, 1818b, and 1818c, relative to the ends of the bit lines, are depicted. The word line drivers and bit line drivers are not required to be located at the ends of the lines. In one embodiment, the word line drivers and/or the bit line drivers are located at a midpoint of the word line or bit line.

Memory cell 701b is connected to WL 1806a and bit line 1808a. Memory cell 701b is associated with track resistance 1802b. Track resistance 1802b includes resistance 1810a, memory cell 701b, and resistance 1812a. Memory cell 701c is connected to WL 1806c and bit line 1808c. Memory cell 701b is an example of a near-near memory cell in that it is near to both the end of the word line to which the current is provided, as well as being close to the end of the bit line to which the voltage is applied.

Memory cell 701c is associated with track resistance 1802c. Track resistance 1802c includes resistance 1810g, resistance 1810h, resistance 1810i, memory cell 701c, resistance 1812i, resistance 1812f, and resistance 1812c. Memory cell 701c is an example of a far-far memory cell in that it is far from both the end of the word line to which the current is provided, as well as being far from the end of the bit line to which the voltage is applied.

If, for the sake of example, each of the word line resistance segments 1810a-1810i is R_WL and each of the bit line resistance segments 1812a-1812i is R_BL then the track resistance for memory cell 701b is R_WL+R_BL. The track resistance for memory cell 701c is 3*(R_WL+R_BL). A cross-point array will typically have many more bit lines and word lines than in the example in FIG. 18. Hence, the track resistance associated with a far-far memory cell may be far greater than the track resistance associated with a near-near memory cell.

Figure 19:
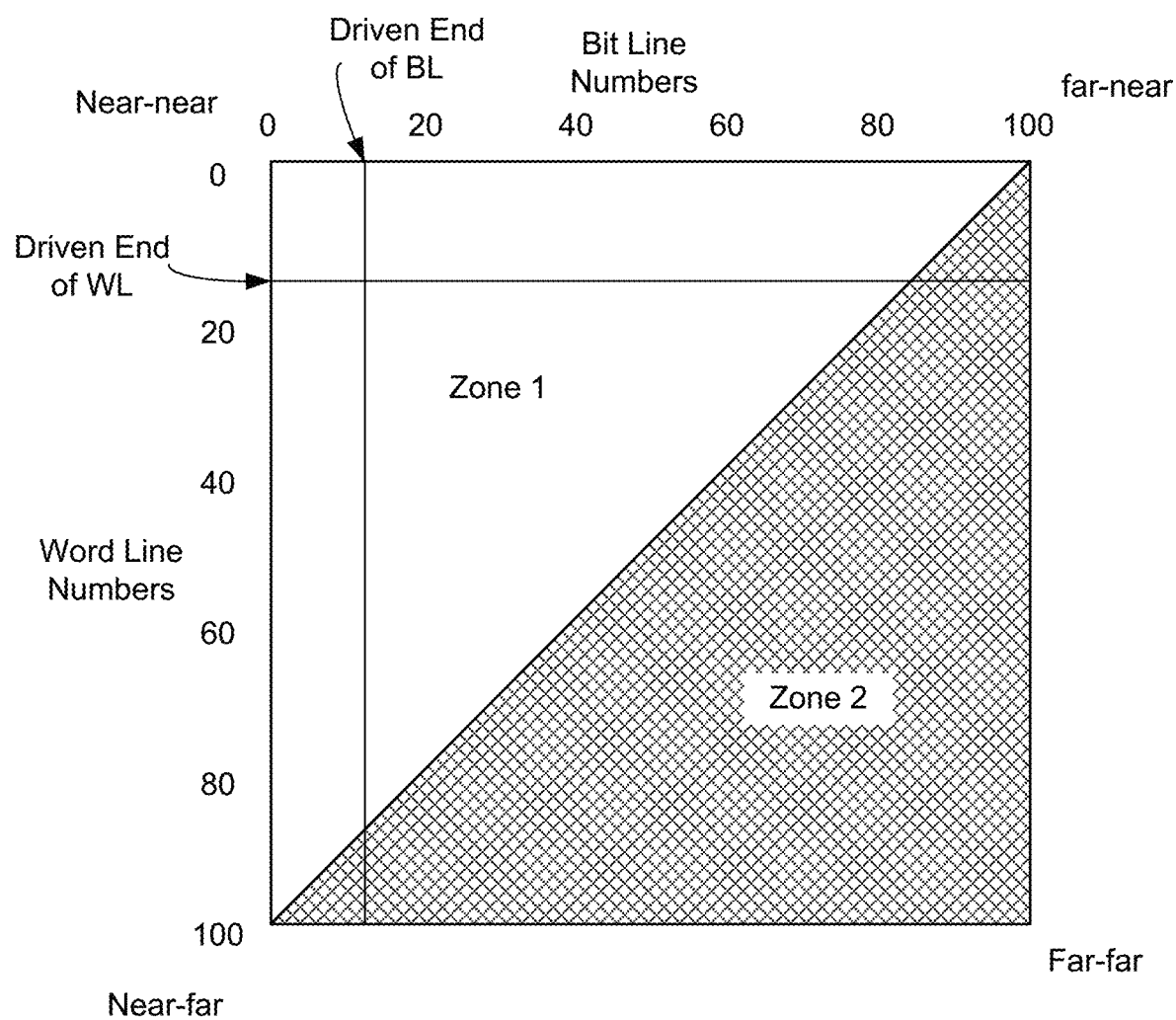
FIG. 19 shows an example in which the cross-point array is divided into two zones.

In some embodiments, the voltage limit to which the selected word line is clamped depends on a zone in which the selected memory cell resides. FIG. 19 shows an example in which the cross-point array is divided into two zones. In this example, there are 100 word lines and 100 bit lines. Only one word line and one bit line are depicted. The left ends of the word lines are driven by the access currents (drivers not depicted in FIG. 19). The top ends of the bit lines are driven by the select voltages (drivers not depicted in FIG. 19). The track resistances for memory cells in Zone 1 is higher than the track resistances for memory cells in Zone 2. In an embodiment, the voltage limit is greater for Zone 2 than for Zone 1.

Memory cells that are near both the driven end of the WL and the driven end of the BL are referred to as near-near cells and are in Zone 1. Memory cells that are far from the driven end of the WL and the driven end of the BL are referred to as far-far cells and are in Zone 2. A memory cell that is far from the driven end of the WL, but near to the driven end of the BL (a far-near cell) is near the border between Zone 1 and Zone 2. Likewise, a memory cell that is close to the driven end of the WL, but far from the driven end of the BL (a near-far cell) is near the border between Zone 1 and Zone 2.

The zone concept depicted in FIG. 19 may be extended to a greater number of zones. The zones may be characterized on the track resistances associated with the memory cells. For example, the memory cells can be ranked based on track resistance. Then, "n" zones of memory cells can be formed based on the rankings, such that each zone contains memory cells with similar track resistances.

Figure 20:
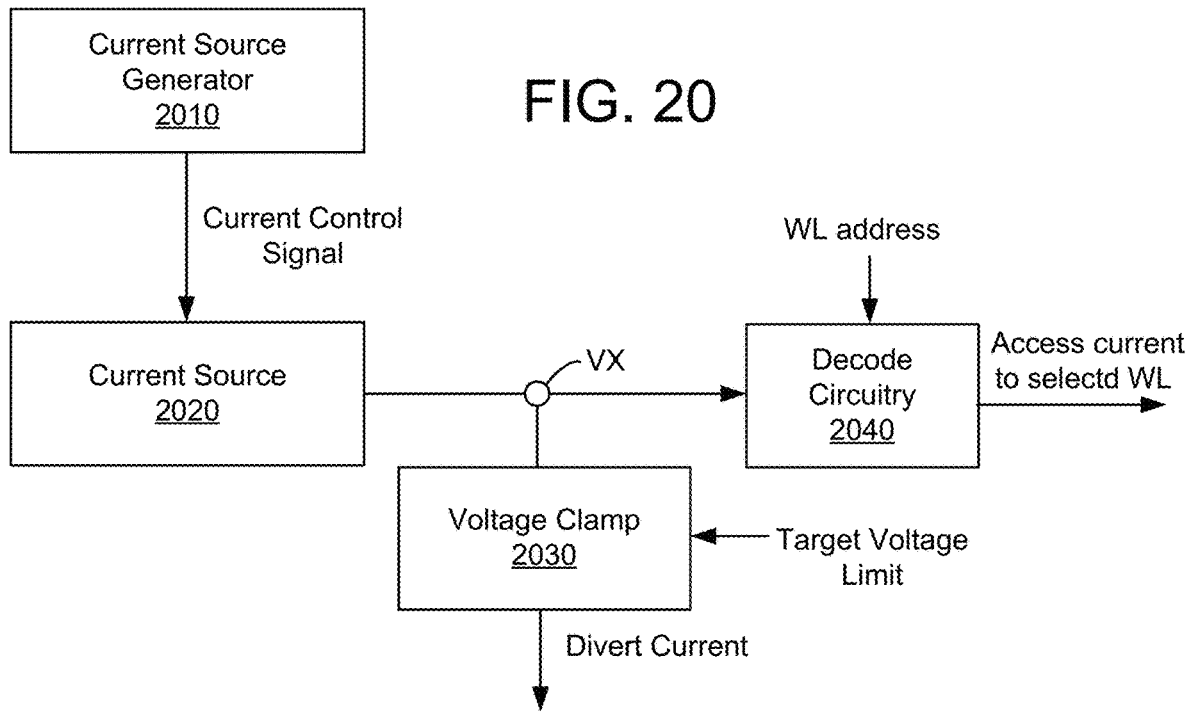
FIG. 20 is a block diagram of components for clamping a voltage on a word line while forcing a current through the word line.

FIG. 20 is a block diagram of components for clamping a voltage on a word line while forcing a current to the word line. The current source generator 2010 generates and outputs a current control signal, which is provided to the current source 2020. In an embodiment, the current control signal is a high-precision voltage. The current source 2020 outputs a fixed magnitude current in response to the current control signal. The current source 2020 could be used to generate a read current or a write current, which may be referred to as an access current. The access current is provided to the selected word line by way of decode circuitry 2040. The decode circuitry 2040 inputs a WL address, and provides the access current to the selected word line. The state machine 562 may provide the WL address to the decode circuitry 2040. In an embodiment, there are separate current sources 2020 for generating the read current and the write current, with selection logic to select the appropriate current source for the memory operation. In an embodiment, there is a first current source for generating a positive write current and a second current source for generating a negative write current. Not depicted in FIG. 20 is a bit line driver, which may provide a select voltage to the selected bit line. The access current may flow through a portion of the selected word line, through the selected memory cell, and through a portion of the selected bit line.

The voltage clamp 2030 samples the voltage at the node labeled "VX," which will be referred to as a global node. The voltage clamp 2030 diverts a portion of the access current from going to the selected word line, if necessary, to keep the voltage on the global node VX from exceeding a target voltage limit. Hence, the voltage clamp 2030 diverts a portion of the access current from going to the selected word line, if necessary, to keep the maximum voltage on the selected word line from exceeding a voltage limit. The voltage clamp 2030 receives a control signal ("Target Voltage Limit"), which allows the magnitude of the maximum allowed voltage on the global node VX to be selectable. In some embodiments, the target limit voltage is based on the zone in which the selected memory cell resides. The control signal may be an analog voltage. In an embodiment, the control signal is provided by the state machine 562.

Figure 21:
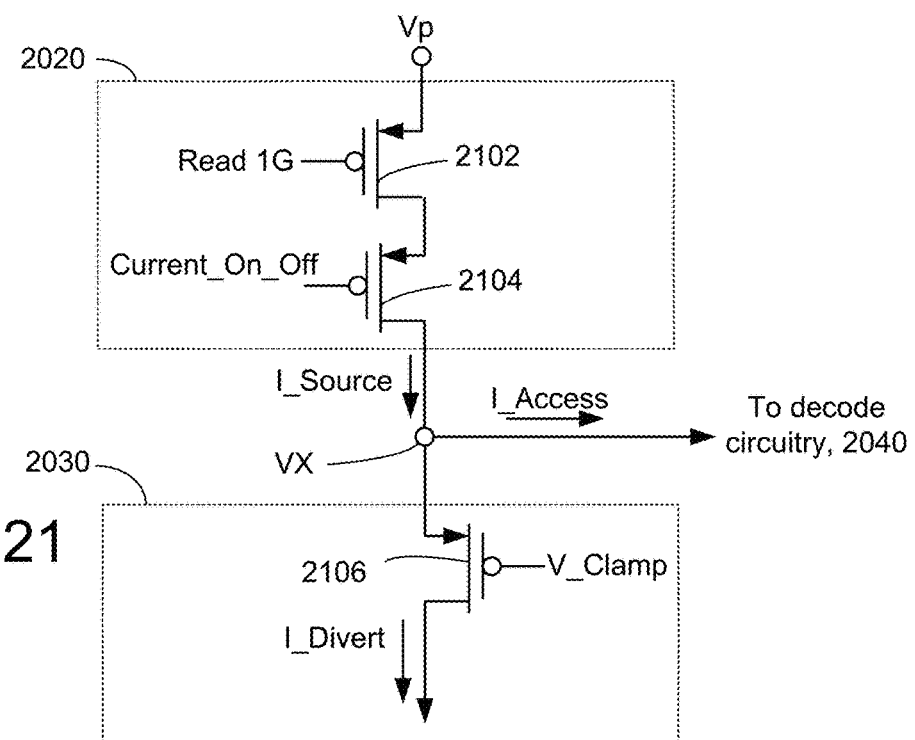
FIG. 21 is a schematic diagram of one embodiment of a current source and voltage clamp.

FIG. 21 is a schematic diagram of one embodiment of the current source and voltage clamp. In FIG. 21, the current source 2020 generates a current ($I_{source}$). The current source includes current generation transistor 2102 and on/off transistor 2104. Current generation transistor 2102 receives voltage Read_1G from the current source generator 2010. Current generation transistor 2102 is scaled at a suitable size to generate the target magnitude for the current (I_Source). In one embodiment, the current source 2020 is used to generate a read current of about 15 micro-Amperes. In one embodiment, the current source 2020 is used to generate a write current of about 30 micro-Amperes.

On/off transistor 2104 is used to control whether I_Source is output by the current source 2020. The signal "Current_On_Off" may be provided by the system control logic 360. On/off transistor 2104 provides I_Source to node VX, assuming that the current source has been selected. Node VX is connected to the decode circuitry 2040, such that at least a portion of I_Source is provided to the selected word line.

The voltage clamp 2030 includes voltage clamp transistor 2106, which samples the voltage at the global node VX. The gate of voltage clamp transistor 2106 receives a control signal "V_clamp". The control signal is used to set the magnitude of the voltage that is allowed on the global node VX, and hence the magnitude of the voltage that is allowed on the selected word line. Since the global node VX is connected to the selected word line by way of the decode circuitry 2040 the voltage on the selected word line is not necessarily equal to the voltage at the global node VX. However, any differences in voltage due to passing the current through the decode circuitry 2040 can be factored into the voltage that is allowed on the global node VX. The voltage clamp transistor 2106 will divert a portion of I_Source, if necessary, to prevent the voltage at the global node VX from exceeding the voltage limit. The current may be diverted to ground and away from the selected memory element.

Figure 22:
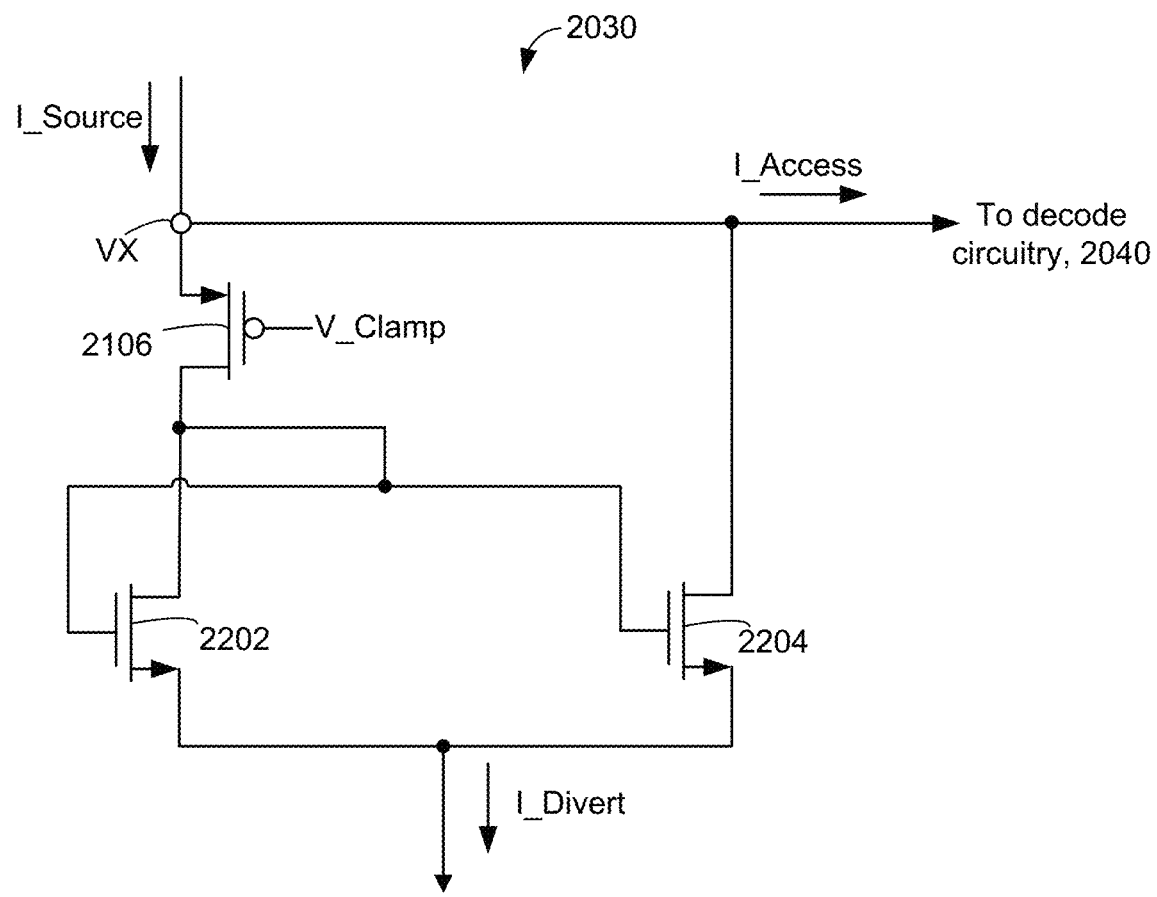
FIG. 22 is a schematic diagram of another embodiment of a voltage clamp.

FIG. 22 is a schematic diagram of another embodiment of the voltage clamp 2030. In this embodiment, the voltage clamp 2030 has a feedback loop. The voltage clamp transistor 2106 is again depicted as being connected to the global node VX. Two feedback transistors 2202, 2204 are added in this embodiment. The feedback transistors provide additional stability in the control of the magnitude of the voltage at the global node VX. In one embodiment, the feedback transistors provide a high gain feedback to reduce the variation in Vt with the current diverted by the clamp transistor 2106.

Figure 23:
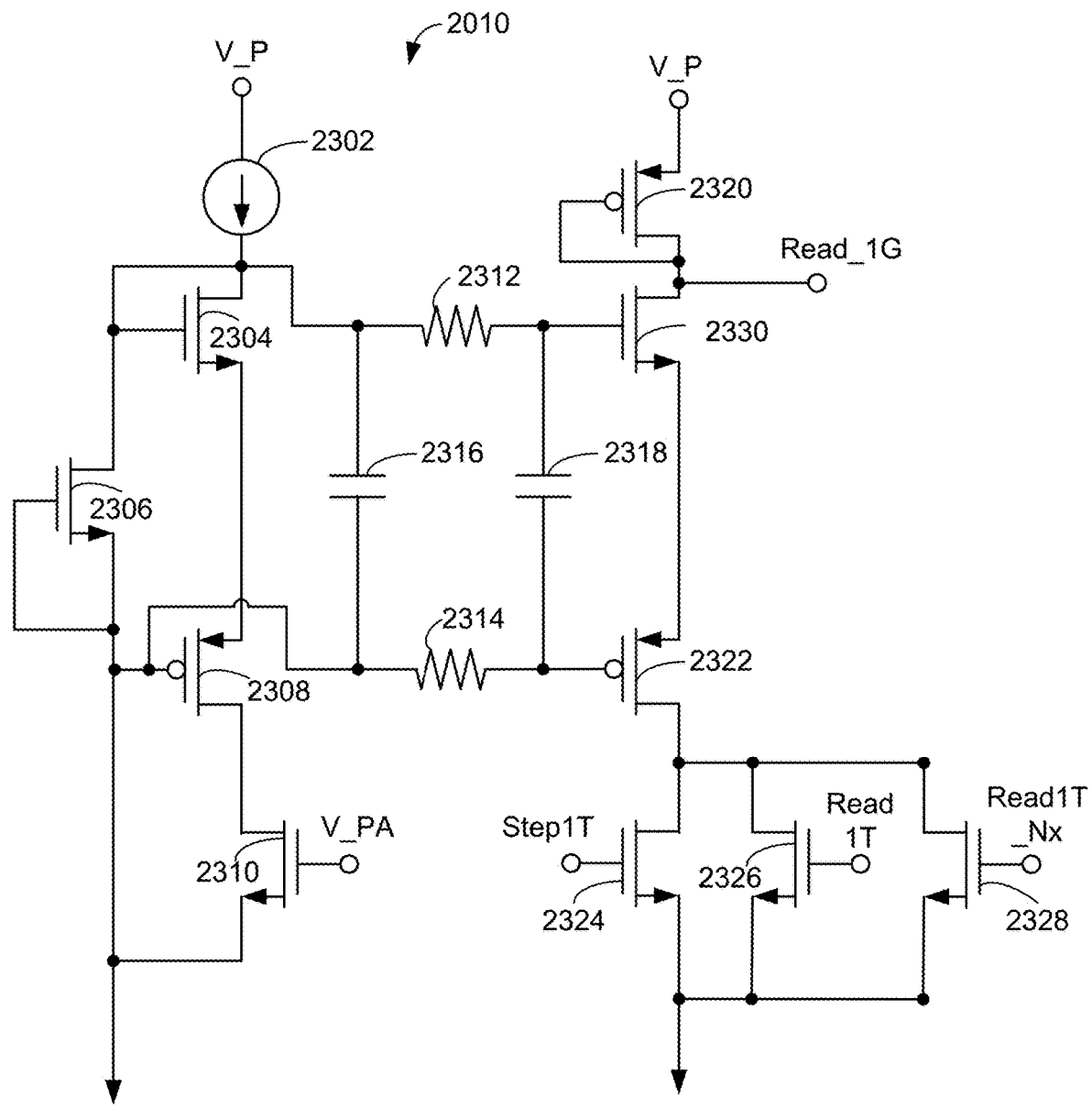
FIG. 23 is a schematic diagram of one embodiment of a current generator.

FIG. 23 is a schematic diagram of one embodiment of the current source generator 2010. The current source generator 2010 outputs voltage Read_1G (between transistors 2320 and 2330), which is provided to the current source 2020. In some embodiments, Read_1G may be provided to several types current sources, such as a read current source, a positive current write source, and a negative current write source.

The gates of transistors 2330 and 2322 are provided voltages by resistors 2312 and 2314, respectively. Those resistor voltages are generated by the left-side circuitry, which includes current source 2302, transistor 2304, transistor 2306, transistor 2308, and transistor 2310, as well as capacitors 2316 and 2318. The current source 2302 may be about 5 micro-Amperes. The right-side circuitry includes transistors 2320, 2330, 2322, 2324, 2326, and 2328. In some embodiments, the left-side circuitry is used for an entire bank, with a separate version of the right-side circuity being used for each tile. The current source 2302, for example 5 ua, may generate a voltage approximately 2 Vt above ground on the drain of transistor 2304 that is distributed to the tiles. V_PA into the gate of transistor 2310 may be high (e.g., V_P) to activate the circuit, or it may open the circuit if the gate of transistor 2310 is taken to ground so current is eliminated when the circuit is unused. The gate of transistor 2304 may be distributed to the tiles and drive no source or drains to eliminate drops to the tiles and render the resulting current in the tiles relatively the same for each. In turn, the two distributed voltages at approximately 1.5V and 0V are connected in each tile to generators on the right. That is, the gate of transistor 2330 will be approximately 1.5V, and the gate of transistor 2322 approximately 0V. In turn, those mirror circuits may be turned on by either Step1T, Read1T, or Read1T_NX high at V_P. The result is that the current of current source 2302 is driven into transistor 2320 drain and the gate of transistor 2320 will be at V_P-Vt, or approximately 2.5V if V_P is 3.3V.

Figure 24:
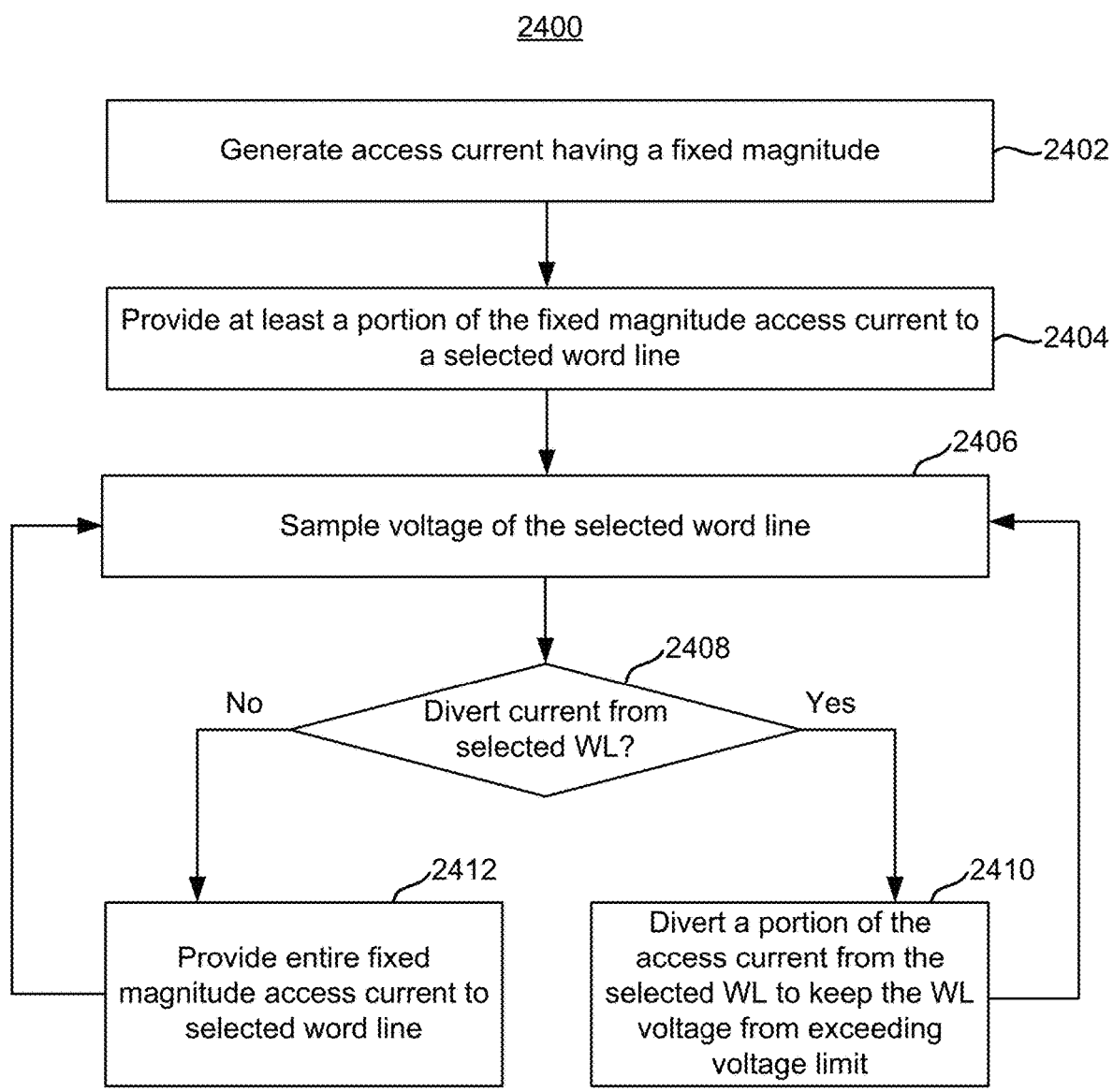
FIG. 24 is a flowchart of one embodiment of a process of clamping a voltage on a selected word line when using a forced current approach to access a memory cell in a cross-point array.

FIG. 24 is a flowchart of one embodiment of a process 2400 of clamping a voltage on a selected word line when using a forced current approach to access a memory cell in a cross-point array. The process 2400 provides further details of one embodiment of process 1600. Reference will be made to circuity in FIGS. 21-23 when describing process 2400. However, process 2400 is not limited to that circuitry.

Step 2402 includes generating an access current having a fixed magnitude. In one embodiment, the combination of current source generator 2010 in FIG. 23 and current source 2020 in FIG. 21 generate the fixed magnitude access current. With reference to FIG. 21, the fixed magnitude access current is referred to as I_Source.

Step 2404 includes providing at least a portion of the fixed magnitude access current to a selected word line. With reference to FIG. 21, I_Access is provided to the selected word line by way of the decode circuitry 2040. I_Access could have the same magnitude as I_Source or may be smaller than I_Source depending on whether the resulting voltage on VX in FIG. 21 is higher than where the Vclamp diverts current.

Step 2406 includes sampling a voltage of the selected word line. With reference to FIG. 21 or 22, the voltage clamp 2030 samples the voltage at the global node VX, which serves to sample the voltage on the selected word line.

Step 2408 is a determination of whether to divert current from going to the selected word line. This determination may be made by the voltage clamp transistor 2106 sampling the voltage on the global node VX. If some of the current is to be diverted, then step 2410 is performed. Step 2410 includes diverting a portion of the access current from the selected word line to keep the word line voltage from exceeding a voltage limit. With reference to FIG. 21 or 22, the voltage clamp transistor 2106 diverts a portion of I_Source from going to the selected word line.

If the current is not to be diverted, then step 2412 is performed. Step 2412 includes providing the entire fixed access current to the selected word line. With reference to FIG. 21 or 22, the voltage clamp transistor 2106 does not divert any of I_Source from going to the selected word line.

In view of the foregoing, it can be seen that, according to a first aspect, an apparatus comprises a control circuit configured to connect to a cross-point memory array. The cross-point memory array comprises a plurality of first conductive lines, a plurality of second conductive lines, and a plurality of non-volatile memory cells each connected between one of the first conductive lines and one of the second conductive lines. Each memory cell comprises a memory element and a select element. The control circuit is configured to force an access current through a first portion of a selected first conductive line, a selected memory cell, and a second portion of a selected second conductive line. The selected memory cell is connected between the selected first conductive line and the selected second conductive line. The control circuit is configured to limit a maximum voltage difference between the selected first conductive line and the selected second conductive line to a voltage limit while forcing the access current through the first portion of the selected first conductive line, the selected memory cell, and the second portion of the selected second conductive line.

In a second aspect, in furtherance of the first aspect, the control circuit is further configured to select the voltage limit based on a location of the selected memory cell in the cross-point memory array.

In a third aspect, in furtherance of the first or second aspects, the control circuit is further configured to select the voltage limit based on resistance of the first portion of the selected first conductive line in which the access current flows and the second portion of the selected second conductive line in which the access current flows.

In a fourth aspect, in furtherance of any of the first to third aspects, the selected memory cell resides in one of a plurality of zones in the cross-point memory array. Each zone is characterized by a current-resistance (IR) drop along a path comprising a first region of one of the first conductive lines and a second region of one of the second conductive lines in which an access current is forced when accessing a memory cell in the zone. The control circuit is further configured to select the voltage limit based on which zone the selected memory cell resides.

In a fifth aspect, in furtherance of any of the first to fourth aspects, the control circuit is further configured to hold the access current to a fixed current when the maximum voltage difference between the selected first conductive line and the selected second conductive line is below the voltage limit. The control circuit is further configured to reduce the access current that is forced through the first portion of the selected first conductive line, the selected memory cell, and the second portion of the selected second conductive line to keep the maximum voltage difference between the selected first conductive line and the selected second conductive line from exceeding the voltage limit.

In a sixth aspect, in furtherance of any of the first to fifth aspects, the control circuit comprises a current source having an output configured to provide a fixed magnitude current. The control circuit comprises a voltage clamp coupled to the output of the current source. The voltage clamp is configured to divert a portion of the fixed magnitude current away from the selected first conductive line to limit the maximum voltage difference between the selected first conductive line and the selected second conductive line to the voltage limit.

In a seventh aspect, in furtherance of any of the first to sixth aspects, the apparatus further comprises the cross-point memory array. The select element comprises a threshold switching selector configured to become conductive in response to application of a voltage level exceeding a threshold voltage of the threshold switching selector, the threshold switching selector connected in series with the memory element of the respective memory cell. The control circuit is further configured to establish a voltage between the selected first conductive line and the selected second conductive line to turn on the threshold switching selector in the selected memory cell.

In an eighth aspect, in furtherance of any of the first to seventh aspects, the apparatus further comprises a first semiconductor die comprising the cross-point memory array. The apparatus further comprises a second semiconductor die affixed to the first semiconductor die. The second semiconductor die comprises the control circuit.

In a ninth aspect, in furtherance of any of the first to eighth aspects, the access current is one of a read access current and a write access current. The control circuit is configured to determine a state of the selected memory cell in response to forcing the read access current through the selected memory cell. The control circuit is configured to change a state of the selected memory cell by forcing the write access current through the selected memory cell.

In a tenth aspect, in furtherance of any of the first to ninth aspects, each memory cell comprises a magnetoresistive random access memory (MRAM) element in series with the select element.

A further aspect includes a method of operating a cross-point memory array. The method comprises generating, by a current source, a fixed magnitude access current. The method comprises forcing, by a control circuit, at least a portion of the fixed magnitude access current through a selected memory cell in the cross-point memory array. The cross-point memory array comprises a plurality of word lines, a plurality of bit lines, and a plurality of magnetoresistive random access memory (MRAM) cells each connected between one of the word lines and one of the bit lines. The selected memory cell resides between a selected word line and a selected bit line. The method comprises diverting, by a voltage clamp, a portion of the fixed magnitude access current from flowing through the selected memory cell to limit a voltage across the selected memory cell to a voltage limit.

A further aspect includes a non-volatile memory system, comprising a cross-point memory array comprising a plurality of first conductive lines, a plurality of second conductive lines, and a plurality of magnetoresistive random access memory (MRAM) cells. Each MRAM cell resides between a cross-point of one of the plurality of first conductive lines and a corresponding one of the plurality of second conductive lines. The non-volatile memory system comprises a control circuit coupled to the cross-point memory array. The control circuit applies a select voltage to a selected first conductive line of the cross-point memory array. The control circuit provides at least a portion of a fixed magnitude access current to a selected second conductive line of the cross-point memory array while the select voltage is applied to the selected first conductive line. A selected memory cell resides between the selected first conductive line and the selected second conductive line. The control circuit diverts a portion of the fixed magnitude access current from the selected second conductive line to limit a maximum voltage on the selected second conductive line to a voltage limit while the select voltage is provided to the selected first conductive line.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
  one or more control circuits configured to connect to a cross-point memory array, the cross-point memory array comprising a plurality of first conductive lines, a plurality of second conductive lines, and a plurality of non-volatile memory cells each connected between one of the first conductive lines and one of the second conductive lines, wherein each memory cell comprises a programmable resistance memory element in series with a select element, wherein the one or more control circuits are configured to:
  apply a select voltage to a selected first conductive line;
  apply an access current to a selected second conductive line while holding the selected first conductive line at the select voltage to force the access current through a selected memory cell that is connected between the selected first conductive line and the selected second conductive line; and
  clamp a voltage on the selected second conductive line to a voltage limit while applying the access current to the selected second conductive line.

2. The apparatus of claim 1, wherein the one or more control circuits are further configured to:
  hold the access current to a fixed current when a maximum voltage difference between the selected first conductive line and the selected second conductive line is below the voltage limit; and
  reduce the access current to keep the maximum voltage difference between the selected first conductive line and the selected second conductive line from exceeding the voltage limit.

3. The apparatus of claim 1, wherein the one or more control circuits comprise:
  a current source having an output configured to provide a fixed magnitude current; and
  a voltage clamp coupled to the output of the current source, the voltage clamp configured to divert a portion of the fixed magnitude current away from the selected first conductive line to limit a maximum voltage difference between the selected first conductive line and the selected second conductive line to the voltage limit.

4. The apparatus of claim 3, wherein the voltage clamp is further configured to:
  sample a voltage on the selected second conductive line.

5. The apparatus of claim 3, wherein the voltage clamp comprises:
  a clamp transistor configured to divert a portion of the fixed magnitude current from flowing to the selected second conductive line.

6. The apparatus of claim 1, further comprising the cross-point memory array, wherein the select element comprises a threshold switching selector configured to become conductive in response to application of a voltage level exceeding a threshold voltage of the threshold switching selector, wherein the threshold switching selector is connected in series with the programmable resistance memory element of the respective memory cell; and
  the one or more control circuits are further configured to establish a voltage between the selected first conductive line and the selected second conductive line to turn on the threshold switching selector in the selected memory cell.

7. The apparatus of claim 1, further comprising:
  a first semiconductor die comprising the cross-point memory array; and
  a second semiconductor die affixed to the first semiconductor die, wherein the second semiconductor die comprises the one or more control circuits.

8. The apparatus of claim 1, wherein:
  the access current comprises a read access current; and
  the one or more control circuits are configured to determine a state of the selected memory cell in response to applying the read access current to the selected second conductive line and through the selected memory cell.

9. The apparatus of claim 1, wherein:
  the access current comprises a write access current; and
  the one or more control circuits are configured to change a state of the selected memory cell by applying the write access current to the selected second conductive line and through the selected memory cell.

10. The apparatus of claim 1, wherein:
  the select element of each respective memory cell comprises a threshold switching selector configured to become conductive in response to application of a voltage level exceeding a threshold voltage of the threshold switching selector.

11. The apparatus of claim 1, wherein the select element of each respective memory cell comprises an Ovonic Threshold Switch (OTS).

12. A method of operating a cross-point memory array, the cross-point memory array comprising a plurality of first conductive lines, a plurality of second conductive lines, and a plurality of memory cells each connected at a different cross-point junction between one of the first conductive lines and one of the second conductive lines, wherein each memory cell comprises a reversible resistivity memory element in series with a threshold switching select element, the method comprising:

forcing, by one or more control circuits, an access current through a first region of a selected first conductive line, a selected memory cell, and a second region of a selected second conductive line, wherein the selected memory cell is connected at the cross-point junction between the selected first conductive line and the selected second conductive line; and limiting, by the one or more control circuits, a maximum voltage difference between the selected first conductive line and the selected second conductive line to a voltage limit while forcing the access current through the first region of the selected first conductive line, the selected memory cell, and the second region of the selected second conductive line.

13. The method of claim 12, wherein forcing, by one or more control circuits, the access current through the first region of the selected first conductive line, the selected memory cell, and the second region of the selected second conductive line comprises:

generating, by a current source, a fixed magnitude access current; and forcing, by the one or more control circuits, at least a portion of the fixed magnitude access current through the first region of the selected first conductive line, the selected memory cell, and the second region of the selected second conductive line.

14. The method of claim 13, wherein limiting, by the one or more control circuits, the maximum voltage difference between the selected first conductive line and the selected second conductive line to the voltage limit comprises:

diverting, by a voltage clamp, a portion of the fixed magnitude access current from flowing through the first region of the selected first conductive line, the selected memory cell, and the second region of the selected second conductive line in order to limit the maximum voltage difference between the selected first conductive line and the selected second conductive line to the voltage limit.

15. A non-volatile memory system, comprising:

a cross-point memory array comprising a plurality of first conductive lines extending in a first direction, a plurality of second conductive lines extending in a second direction perpendicular to the first direction, and a plurality of magnetoresistive random access memory (MRAM) cells, wherein each MRAM cell resides between a cross-point junction of one of the plurality of first conductive lines and a corresponding one of the plurality of second conductive lines;

a current source configured to generate a fixed magnitude access current;

a voltage clamp coupled to the current source; and one or more control circuits coupled to the cross-point memory array, the current source, and the voltage clamp, wherein the one or more control circuits are configured to:

apply a select voltage to a selected first conductive line of the cross-point memory array;

provide at least a portion of the fixed magnitude access current to a selected second conductive line of the cross-point memory array while the select voltage is applied to the selected first conductive line to force at least a portion of the fixed magnitude access current through a selected MRAM cell that resides between the selected first conductive line and the selected second conductive line; and send a control signal to the voltage clamp to limit a voltage across the selected MRAM cell to a target voltage limit while at least the portion of the fixed magnitude access current is forced through the selected MRAM cell.

16. The non-volatile memory system of claim 15, wherein the voltage clamp comprises a transistor configured to:

divert a portion of the fixed magnitude access current from the selected second conductive line to limit a maximum voltage across the selected MRAM cell to the target voltage limit.

17. The non-volatile memory system of claim 15, further comprising:

a decode circuit coupled between the voltage clamp and the plurality of second conductive lines of the cross-point memory array, wherein the decode circuit is configured to connect the current source and the voltage clamp to the selected second conductive line responsive to a control signal from the one or more control circuits.

18. The non-volatile memory system of claim 15, wherein:

each MRAM cell comprises a threshold switching selector in series with a magnetic element, wherein the threshold switching selector is configured to become conductive in response to application of a voltage level exceeding a threshold voltage of the threshold switching selector; and the one or more control circuits are further configured to create a voltage between the selected first conductive line and the selected second conductive line to turn on the threshold switching selector in the selected MRAM cell to allow at least the portion of the fixed magnitude access current to flow through the selected MRAM cell.

19. The non-volatile memory system of claim 15, wherein the voltage clamp is further configured to:

sample a voltage on the selected second conductive line.

20. The non-volatile memory system of claim 15, wherein:

the plurality of first conductive lines comprise word lines; and the plurality of second conductive lines comprise bit lines.

* * * * *